(12) United States Patent
Donofrio

(10) Patent No.: US 8,957,430 B2
(45) Date of Patent: Feb. 17, 2015

(54) GEL UNDERFILL LAYERS FOR LIGHT EMITTING DIODES

(75) Inventor: Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 413 days.

(21) Appl. No.: 13/369,996

(22) Filed: Feb. 9, 2012

(65) Prior Publication Data

US 2012/0319142 A1 Dec. 20, 2012

Related U.S. Application Data

(63) Continuation-in-part of application No. 13/160,793, filed on Jun. 15, 2011, now Pat. No. 8,525,190.

(51) Int. Cl.
| | |
|---|---|
| *H01L 29/18* | (2006.01) |
| *H01L 25/075* | (2006.01) |
| *H01L 33/54* | (2010.01) |
| *H01L 33/20* | (2010.01) |
| *H01L 33/50* | (2010.01) |

(52) U.S. Cl.
CPC ............ *H01L 25/0753* (2013.01); *H01L 33/54* (2013.01); *H01L 33/20* (2013.01); *H01L 33/505* (2013.01)
USPC .......................... 257/88; 257/95; 257/E21.532

(58) Field of Classification Search
USPC .................... 257/E21.386, E21.398, E21.539, 257/E21.603
See application file for complete search history.

(56) References Cited

U.S. PATENT DOCUMENTS

| | | | |
|---|---|---|---|
| 6,590,235 B2 | 7/2003 | Carey et al. | |
| 6,791,119 B2 | 9/2004 | Slater, Jr. et al. | |
| 7,217,583 B2 | 5/2007 | Negley et al. | |
| 7,372,198 B2 | 5/2008 | Negley | |
| 2005/0233485 A1 | 10/2005 | Shishov et al. | |
| 2006/0105483 A1 | 5/2006 | Leatherdale et al. | |
| 2008/0048200 A1 | 2/2008 | Mueller et al. | |
| 2010/0308354 A1 | 12/2010 | David et al. | |
| 2011/0031502 A1 | 2/2011 | Bergmann et al. | |
| 2011/0121324 A2 | 5/2011 | Bisberg | |

OTHER PUBLICATIONS

Cree, Inc., "*Cree® XLamp® XP-E High-Efficiency White LEDs*", Data Sheet: CLD-DS34 Rev. 0, Dec. 6, 2010, 11 pp.
Dow Corning Electronics, "*Dow Corning LED Solutions Lighting the way to advanced materials and solutions*", Form No. 11-1679A-01, Nov. 4, 2008.
Dow Corning Electronics, "*Dow Corning Electronics releases the OE-6460 optical encapsulant gel*", Press Release Nov. 10, 2008, LEDs Magazine, retrieved Jun. 13, 2011 from http://www.ledsmagazine.com/press/17227.

(Continued)

*Primary Examiner* — Cheung Lee
(74) *Attorney, Agent, or Firm* — Myers Bigel Sibley & Sajovec, P.A.

(57) ABSTRACT

A light emitting device is fabricated by providing a mounting substrate and an array of light emitting diode dies adjacent the mounting substrate to define gaps. A gel that is diluted in a solvent is applied on the substrate and on the array of light emitting dies. At least some of the solvent is evaporated so that the gel remains in the gaps, but does not completely cover the light emitting diode dies. For example, the gel substantially recedes from the substrate beyond the array of light emitting diode dies and also substantially recedes from an outer face of the light emitting diode dies. Related light emitting device structures are also described.

12 Claims, 14 Drawing Sheets

(56) References Cited

OTHER PUBLICATIONS

Dow Corning Electronics, "*Dow Corning Electronics Introduces New Optical Encapsulant Gel*", Media Release Nov. 3, 2008, retrieved Jun. 13, 2011 from http:/www.dowcorning.de/de_De/content/news/etronics_news_OE6450.aspx.

Emerson et al., "*Gap Engineering for Flip-Chip Mounted Horizontal LEDs*", U.S. Appl. No. 13/112,502, filed May 20, 2011.

Shima, "*Subject: DMA data of OE-6636*" Dow Corning® Electronics Product Specification Sheet, Lab book or reference #499, p. 147, Sep. 25, 2009.

Shima, "*Subject: DMA data of OE-6450*" Dow Corning® Electronics Product Specification Sheet, Lab book or reference #474, p. 74, Sep. 25, 2009.

Shima, "*Subject: DMA data of OE-6630*" Dow Corning® Electronics Product Specification Sheet, Lab book or reference #499, p. 101, Sep. 29, 2009.

Wikipedia: The Free Encyclopedia, "*Dynamic modulus*" retrieved Jun. 14, 2011 from http://en.wikipedia.org/w/index.php?title=Dynamic_modulus&printable=yes.

International Search Report and Written Opinion of the International Searching Authority, Application No. PCT/US 12/41887, Aug. 28, 2012.

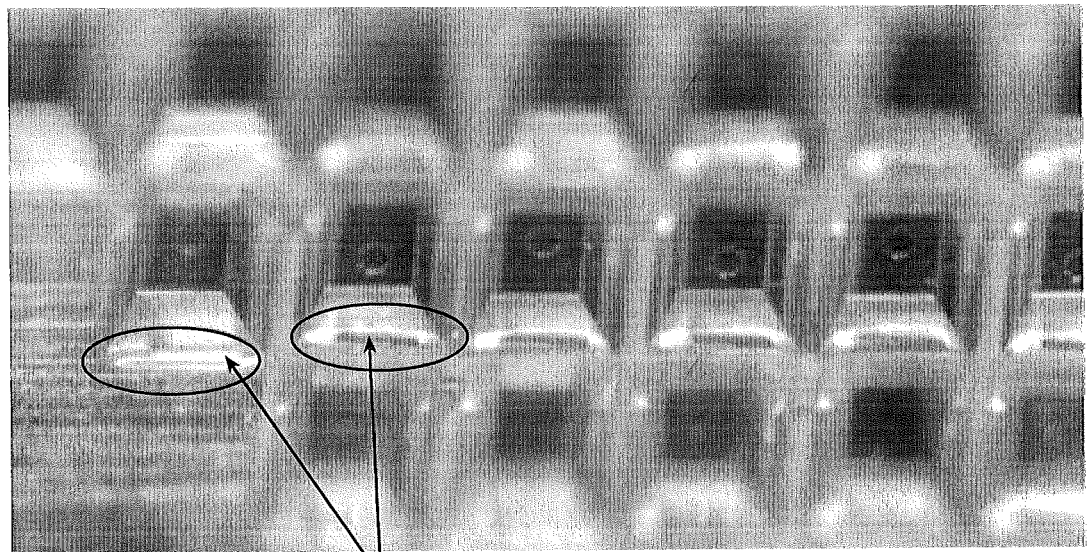
1110c  FIG. 22
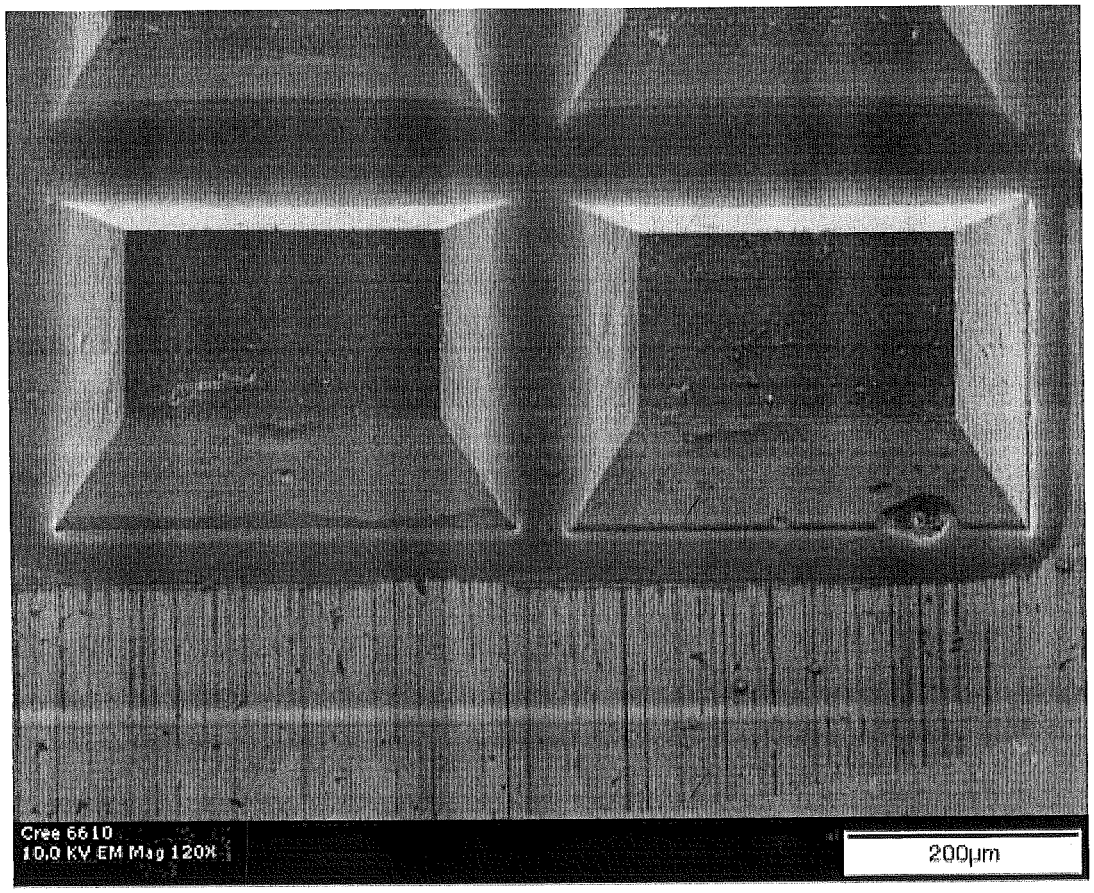
FIG. 23

GEL UNDERFILL LAYERS FOR LIGHT EMITTING DIODES

CROSS-REFERENCE TO RELATED APPLICATION

This application is a continuation-in-part of U.S. patent application Ser. No. 13/160,793, filed Jun. 15, 2011 now U.S. Pat. No. 8,525,190, entitled Conformal Gel Layers for Light Emitting Diodes and Methods of Fabricating Same, assigned to the assignee of the present application, the disclosure of which is hereby incorporated herein by reference as if set forth in its entirety herein.

BACKGROUND OF THE INVENTION

This invention relates to light emitting devices and assemblies and methods of manufacturing the same, and more particularly, to Light Emitting Diodes (LEDs) and assemblies thereof.

LEDs are widely known solid-state lighting elements that are capable of generating light upon application of voltage thereto. LEDs generally include a diode region having first and second opposing faces, and include therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

LEDs are increasingly being used in lighting/illumination applications, with a goal being to provide a replacement for the ubiquitous incandescent light bulb.

SUMMARY OF THE INVENTION

Light emitting devices according to various embodiments described herein include a mounting substrate and an array of light emitting diode dies adjacent the mounting substrate, to define a gap between a respective light emitting diode die and the mounting substrate that is adjacent thereto. A gel layer is provided on the mounting substrate. The gel layer extends at least partially in the gaps between the light emitting diode dies and the substrate adjacent thereto, to provide an underfill. However, the gel layer does not completely cover the light emitting diode dies. In some embodiments, the gel layer does not extend on the substrate substantially beyond the array of light emitting diode dies, and also does not extend substantially on an outer face of the light emitting diode dies. As used herein, a "gel" means a colloid in which a disperse phase has combined with a dispersion medium to produce a semi-solid material, such as a jelly. Moreover, as used herein, "substantially" means that there may be some isolated islands of gel present in the given region, but the gel layer itself does not extend in the given region.

In some embodiments, an array of bond regions is provided, a respective one of which connects a respective light emitting diode die to the mounting substrate. A respective bond region is recessed from an edge of a respective light emitting diode die, to define a respective gap. Moreover, in some embodiments, the gel layer fills the gaps. Also, in some embodiments, the gel layer also extends between adjacent light emitting diode dies in the array. Finally, in other embodiments, the gel layer may also extend at least partially, and in some embodiments fully, on sidewalls of the light emitting diode dies.

Light emitting devices that include a gel underfill layer according to any embodiments described herein, may also include a conformal or nonconformal phosphor layer. As used herein, a "conformal" layer includes opposing surfaces that both conform to a contour of the underlying element on which the conformal layer extends. Moreover, as used herein, the term "phosphor" includes any wavelength conversion materials that are sometimes called luminescent, fluorescent and/or phosphorescent. The phosphor layer is directly on the substrate, extends beyond the array of light emitting diode dies and also extends directly on the outer faces of the light emitting diode dies. In other embodiments, a lens is provided that spans the array of light emitting diode dies and extends directly on the substrate beyond the array of light emitting diode dies and directly on the outer faces of the light emitting diode dies. A conformal or nonconformal phosphor layer and a lens may also be provided according to other embodiments described herein, wherein the lens is on at least a portion of the phosphor layer.

Various embodiments described above have included an array of light emitting diode dies adjacent the mounting substrate. However, in other embodiments, a single light emitting diode die may be provided adjacent the mounting substrate to define a gap between the light emitting diode die and the mounting substrate that is adjacent thereto. A gel layer is provided on the mounting substrate. The gel layer extends at least partially in the gap between the light emitting diode die and the substrate adjacent thereto, but does not completely cover the light emitting diode die. In some embodiments, the gel does not extend on the substrate substantially beyond the light emitting diode die, and also does not extend substantially on an outer face of the light emitting diode die. In some embodiments, the gel layer fills the gap and/or extends at least partially on sidewalls of the light emitting diode die, as also described above. A phosphor layer and/or a lens may also be provided, as was described above.

Light emitting devices may be fabricated, according to various embodiments described herein, by providing a mounting substrate and an array of light emitting diode dies adjacent the mounting substrate to define a gap between a respective light emitting diode die and the mounting substrate that is adjacent thereto. A gel that is diluted in a solvent is applied on the substrate and on the array of light emitting diode dies. At least some of the solvent is then evaporated, so that the gel remains in the gaps, but does not completely cover the light emitting diode dies. In some embodiments, the gel substantially recedes from the substrate, for example from reflective areas of the substrate, beyond the array of light emitting diode dies, and also substantially recedes from an outer face of the light emitting diode dies.

The gel may be applied by dispensing at least one drop of gel that is diluted in the solvent on the substrate and on the array of light emitting diode dies, and/or by spraying the gel that is diluted in the solvent on the substrate and on the array of light emitting diode dies. Other gel-applying techniques also may be used. In some embodiments, the gel is diluted in the solvent at a ratio of about 1:4-5 by volume. In some embodiments, the gel may fill the gaps. In other embodiments, the gel may remain in the gaps and on the substrate between adjacent light emitting diode dies, but substantially recedes from the substrate beyond the array of light emitting diode dies and also substantially recedes from an outer face of the light emitting diode dies. In yet other embodiments, the gel may remain at least partially on sidewalls of the light emitting diode dies, as well. A phosphor layer and/or a lens may then be applied or attached.

Method embodiments described above have included an array of light emitting diode dies. However, in other methods described herein, a single light emitting diode die may be provided adjacent the mounting substrate to define a gap, and a gel that is diluted in solvent is applied on the substrate and on the light emitting diode die. At least some of the solvent is evaporated so that the gel remains in the gap, but does not completely cover the light emitting diode die. In some embodiments, the gel substantially recedes from the substrate, for example from reflective areas of the substrate, beyond the light emitting diode die, and also substantially recedes from an outer face of the light emitting diode die. The gel may be applied using dispensing, spraying and/or other techniques, and the gel may fill the gap and/or remain at least partially on sidewalls of the light emitting diode die as was described above. Phosphor and/or a lens also may be applied or attached as was described above.

BRIEF DESCRIPTION OF THE DRAWINGS

FIGS. 20-22 are optical microscope images of light emitting devices according to various embodiments described herein.

FIGS. 23-25 are Scanning Electron Microscope (SEM) images of light emitting devices according to various embodiments described herein.

DETAILED DESCRIPTION

Figure 1:
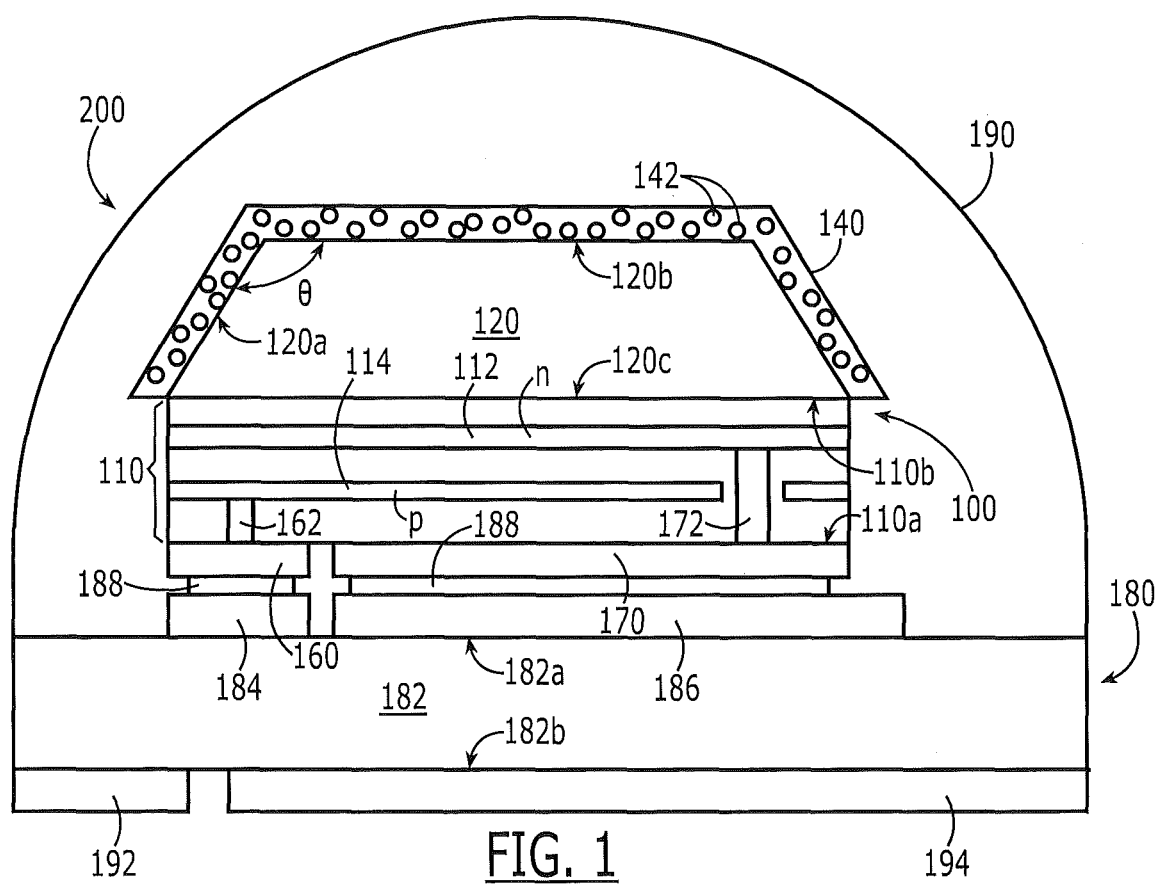
FIGS. 1 and 2 are cross-sectional views of light emitting devices that may be used with various embodiments described herein.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments now will be described generally with reference to gallium nitride (GaN)-based light emitting diodes on silicon carbide (SiC)-based growth substrates for ease of understanding the description herein. However, it will be understood by those having skill in the art that other embodiments of the present invention may be based on a variety of different combinations of growth substrate and epitaxial layers. For example, combinations can include AlGaInP diodes on GaP growth substrates; InGaAs diodes on GaAs growth substrates; AlGaAs diodes on GaAs growth substrates; SiC diodes on SiC or sapphire ($Al_2O_3$) growth substrates and/or a Group III-nitride-based diode on gallium nitride, silicon carbide, aluminum nitride, sapphire, zinc oxide and/or other growth substrates. Moreover, in other embodiments, a growth substrate may not be present in the finished product. For example, the growth substrate may be removed after forming the light emitting diode, and/or a bonded substrate may be provided on the light emitting diode after removing the growth substrate. In some embodiments, the light emitting diodes may be gallium nitride-based LED devices manufactured and sold by Cree, Inc. of Durham, N.C.

Light Emitting Devices

Figure 2:
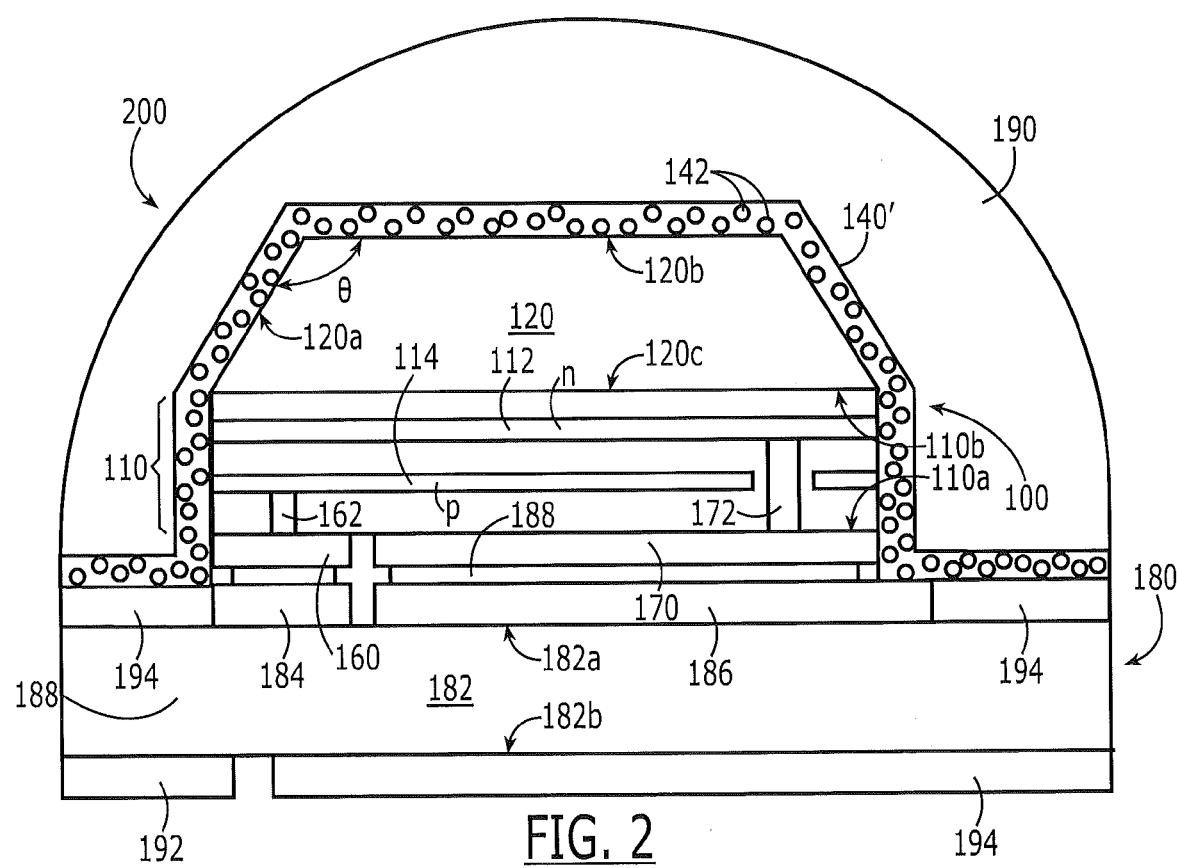

FIGS. 1-2 provide detailed embodiments of representative light emitting devices that may be used with conformal gel layers according to various embodiments that will be described herein. However, many other embodiments of light emitting devices may be used with conformal gel layers, as will be described in detail below. FIGS. 1 and 2 correspond to FIGS. 1 and 2 of application Ser. No. 13/112,502 to Emerson et al., entitled "Gap Engineering for Flip-Chip Mounted Horizontal LEDs", filed May 20, 2011, assigned to the assignee of the present application, the disclosure of which is hereby incorporated herein by reference in its entirety as if set forth fully herein.

FIG. 1 is a cross-sectional view of a light emitting diode die and a packaged light emitting device. Referring to FIG. 1, the light emitting diode die 100 includes a diode region 110 having first and second opposing faces 110a, 110b, respectively, and including therein an n-type layer 112 and a p-type layer 114. Other layers or regions may be provided, which may include quantum wells, buffer layers, etc., that need not be described herein. An anode contact 160 ohmically contacts the p-type layer 114 and extends on a first face 110a. The anode contact 160 may directly ohmically contact the p-type layer 114, or may ohmically contact the p-type layer 114 by way of one or more conductive vias 162 and/or other intermediate layers. A cathode contact 170 ohmically contacts the n-type layer 112 and also extends on the first face 110a. The cathode contact may directly ohmically contact the n-type layer 112, or may ohmically contact the n-type layer 112 by way of one or more conductive vias 172 and/or other intermediate layers. As illustrated in FIG. 1, the anode contact 160 and the cathode contact 170 that both extend on the first face 110a are coplanar. The diode region 110 also may be referred to herein as an "LED epi region", because it is typically formed epitaxially on a substrate 120. For example, a Group III-nitride based LED epi 110 may be formed on a silicon carbide growth substrate. In some embodiments, the growth substrate may be present in the finished product. In other embodiments, the growth substrate may be removed. In still other embodiments, another substrate may be provided that is different from the growth substrate, and the other substrate may be bonded to the LED after removing the growth substrate.

As also shown in FIG. 1, a transparent substrate 120, such as a transparent silicon carbide growth substrate or a transparent sapphire growth substrate, is included on the second face 110b of the diode region 110. The transparent substrate 120 includes a sidewall 120a and may also include an inner face 120c adjacent the second face 110b of the diode region 110 and an outer face 120b, remote from the inner face 120c. The outer face 120b is of smaller area than the inner face 120c. In some embodiments, the sidewall 120a may be stepped, beveled and/or faceted, so as to provide the outer face 120b that is of smaller area than the inner face 120c. In other embodiments, as shown in FIG. 1, the sidewall is an oblique sidewall 120a that extends at an oblique angle θ, and in some embodiments at an obtuse angle, from the outer face 120b towards the inner face 120c. Non-oblique sidewalls and approximately equal faces 120b and 120c also may be provided.

Various embodiments of phosphor layers 140 and diode regions 110 may be provided. For example, in some embodiments, the diode region 110 is configured to emit blue light, for example light having a dominant wavelength of about 450-460 nm, and the conformal layer comprises yellow phosphor, such as YAG:Ce phosphor having a peak wavelength of about 550 nm. In other embodiments, the diode region 110 is configured to emit blue light upon energization thereof, as described above, and the conformal layer 140 may comprise a mixture of yellow phosphor and red phosphor, such as a CASN-based phosphor.

Continuing with the description of FIG. 1, the LED die 100 may be combined with a mounting substrate, such as a submount 180, and a lens 190 to provide a light emitting device 200. The submount 180 may include a body 182 that may comprise aluminum nitride (AlN). In other embodiments, metal core substrates, printed circuit boards, lead frames and/or other conventional packaging substrates may be used to mount the LED die 100 in a flip-chip configuration. The submount 180 includes a submount face 182a, and an anode pad 184 and a cathode pad 186 thereon. The anode and cathode pads may comprise silver-plated copper and/or other conductive materials. As illustrated in FIG. 1, the LED die 100 is mounted on the submount 180, such that the first face 110a is adjacent the submount face 182a, the outer face 110b is remote from the submount 180, the anode contact 184 is adjacent the anode pad 160, and the cathode contact 186 is adjacent the cathode pad 170. In some embodiments, a bonding layer, such as a eutectic gold/tin solder layer 188, is used to electrically, thermally and mechanically connect the anode contact 160 to the anode pad 184, and the cathode contact 170 to the cathode pad 186. In other embodiments, direct attachment of the anode contact 160 to the anode pad 184, and direct attachment of the cathode contact 170 to the cathode pad 186 may be provided, for example using thermocompression bonding and/or other techniques.

A packaged device anode 192 and a packaged device cathode 194 may be provided on a second face 182b of the submount body 182, and may be connected to the anode pad 184 and cathode pad 186, respectively, using internal vias and/or conductive layers that extend on and/or around the submount body 182.

Finally, the packaged light emitting device 200 may also include a lens 190 that extends from submount face 180a to surround the LED die 100. The lens 190 may be a molded plastic lens.

FIG. 2 is a cross-sectional view of another LED die and packaged light emitting device. Compared to embodiments of FIG. 1, the phosphor layer 140' extends across the diode region 110 and/or on the first face 182 of the submount body 182. Moreover, as shown in FIG. 2, the submount 180 may include a layer 194 on the first face 182a thereof. The layer 194 may be an extension of the anode pad 184 and the cathode pad 186 or may be distinct therefrom. In some embodiments, the layer 194 is a reflective layer that extends between the submount face 182a and the conformal layer 140' that includes phosphor that extends on the submount face 182a. This reflective layer 194 can reflect light that passes through the phosphor layer that is on the submount face 182a back toward the lens 190, and can thereby increase efficiency of the LED.

Packaged light emitting devices as described above in connection with FIGS. 1 and 2 may be embodied as a Cree® XLamp® XP-E High-Efficiency White (HEW) LED, as described, for example, in the Cree® XLamp® XP-E High-Efficiency White LEDs Data Sheet, Publication No. CLD-DS34, Rev. 0, dated Dec. 6, 2010, and available at cree.com/ products/xlamp_xpe.asp, the disclosure of which is hereby incorporated herein by reference in its entirety as if set forth fully herein.

FIGS. 1-2 illustrate light emitting diode dies that are configured for flip-chip mounting on a mounting substrate. Various configurations of flip-chip mounted light emitting diode dies may be used in various embodiments described herein. Other light emitting devices according to various embodiments described herein may be configured for non-flip-chip mounting on a mounting substrate, as described and illustrated, for example, in U.S. Patent Application Publication 2011/0031502 to Bergmann et al. entitled "Light Emitting Diodes Including Integrated Backside Reflector and Die Attach", filed Aug. 10, 2009, assigned to the assignee of the present application, the disclosure of which is hereby incorporated herein by reference in its entirety as if set forth fully herein. Moreover, other light emitting devices according to various embodiments described herein may be configured as vertical light emitting devices, as described and illustrated, for example, in U.S. Pat. No. 6,791,119 to Slater, Jr et al., entitled "Light Emitting Diodes Including Modifications for Light Extraction", filed Jan. 25, 2002, assigned to the assignee of the present application, the disclosure of which is hereby incorporated herein by reference in its entirety as if set forth fully herein.

Conformal Gel Layers for Light Emitting Diodes

Various embodiments of gel layers as described herein may be used with horizontal light emitting diode dies, in which both the anode and cathode contacts are on the same surface of the die, or vertical light emitting diode dies, in which the anode and cathode contacts are on opposite surfaces of the light emitting diode die. Moreover, gel layers according to various embodiments described herein may be used with horizontal LED dies that are mounted on a mounting substrate in a flip-chip (contacts adjacent the mounting substrate) or non-flip-chip (contacts remote from the mounting substrate) orientation. Similarly, for vertical devices, gel layers may be used for light emitting diode dies that are mounted on a mounting substrate with the anode contact adjacent the mounting substrate and the cathode contact remote from the mounting substrate, or with the cathode contact adjacent the mounting substrate and the anode contact remote from the mounting substrate. Yet other configurations of LED dies may be used.

Various embodiments described herein may arise from a recognition that a thin and/or conformal gel layer may be used to increase the reliability and/or provide other potential advantages when packaging light emitting diode dies on a mounting substrate. In some embodiments, the thin and/or conformal gel layer may be used to at least partially fill a gap between one or more bond regions that connects the light emitting diode die to the mounting substrate and the edge of the light emitting diode die, so as to prevent high modulus silicone that is used in the phosphor layer from entering into the gap under and around the perimeter of the light emitting diode die sufficiently to degrade the reliability of the bond between the light emitting diode die and the mounting substrate. Moreover, the low modulus thin and/or conformal gel layer may also be employed as a shock absorber or a buffer layer between the phosphor coating and/or lens and the LED die, to reduce stress on the die attach metal bonds during high temperature reflow and/or subsequent device operation. As used herein, "modulus" means an elastic modulus or a complex shear modulus, commonly referred to as G*. The complex shear modulus includes more than one component, such as a storage modulus and a loss modulus. In the case of shear loading, it may also be referred to as a "dynamic modulus".

The gel layer according to various embodiments described herein may be contrasted with a glob of gel or other encapsulation material that may be applied to LEDs as described, for example, in U.S. Pat. No. 6,590,235 to Carey et al., entitled "High Stability Optical Encapsulation and Packaging for Light-Emitting Diodes in the Green, Blue, and Near UV Range". Specifically, a glob of gel that is applied to an LED is typically quite thick. In contrast, a gel layer according to some embodiments described herein may be quite thin and may be less than about 20 μm thick in some embodiments, less than about 10 μm thick in other embodiments, and about 5 μm or about 3 μm thick in still other embodiments. The gel layer may also be a conformal gel layer in some embodiments. Moreover, a phosphor layer may be provided on the gel layer according to some embodiments described herein. In some embodiments, the gel layer and the phosphor layer both comprise silicone, but the phosphor layer is not a gel. In other embodiments, the gel layer is at least five times thinner than the phosphor layer. In still other embodiments, the gel layer has a modulus that is less than the phosphor layer and, in some embodiments, that is at least one, two or three orders of magnitude less than the phosphor layer.

It would also not be predictable to apply a conformal gel layer on the mounting substrate that extends at least partially into the gap, because the silicone-containing phosphor coating or silicone-containing molded lens that are typically used may already be regarded as providing stress relief. However, these silicone-containing coatings may have a relatively high modulus, and may degrade the package reliability during reflow or subsequent device operation, if they encroach into the gap. In contrast, by incorporating a conformal gel layer in the gap, the phosphor layer or molded lens may be prevented from encroaching into the gap. Moreover, the gel layer may exhibit sufficiently low modulus so as not to degrade reliability during reflow and/or subsequent device operation. In other embodiments, the conformal gel layer can be applied to light emitting diode dies in a cavity package and/or a planar package that uses a silicone dam to contain the phosphor layer, with the phosphor layer dispensed to fill the cavity around the gel-coated LED die. The low modulus of the gel layer can provide stress relief to the LED die, so as not to degrade reliability during reflow and/or subsequent device operation.

It would also not be predictable to use a conformal gel layer on an LED die between a phosphor layer and the LED die. Specifically, it is known that the LED die can provide heat sinking for the phosphor layer, and that it is desirable to anchor the phosphor layer to the LED die. Yet, an intermediate conformal gel layer between a conformal or non-conformal phosphor layer and the LED die can actually retain the heat sinking abilities of the LED die while enhancing the reliability of the device, by providing a buffer layer. Moreover, by being conformal to the LED die, anchoring of the phosphor layer and/or the lens may still take place.

Figure 3:
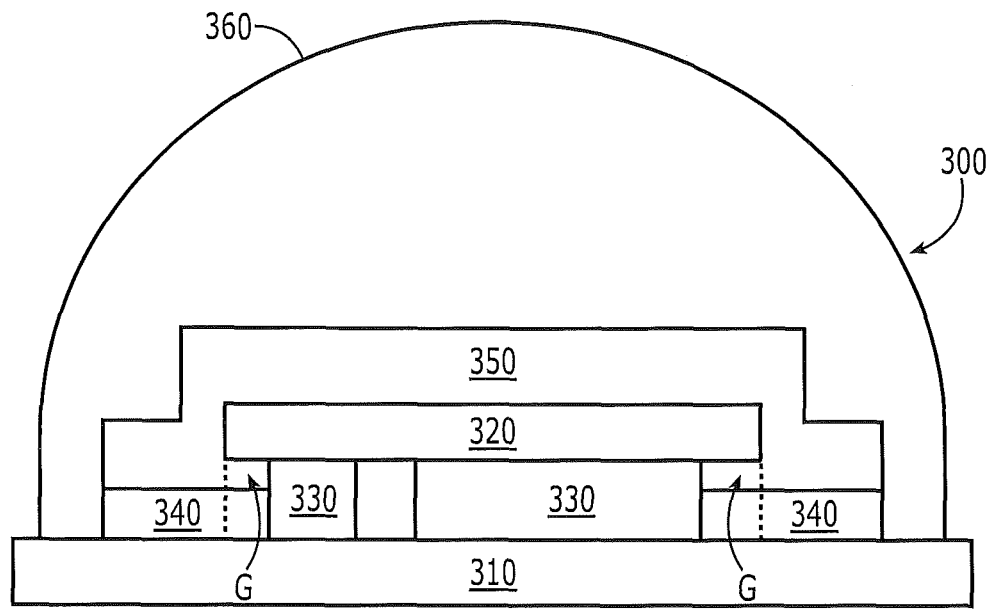
FIGS. 3-7 are cross-sectional views of light emitting devices according to various embodiments described herein.

FIG. 3 is a cross-sectional view of a horizontal, flip-chip light emitting device, such as was illustrated in FIGS. 1 and 2, according to various embodiments described herein. These light emitting devices 300 may include a mounting substrate 310 and a light emitting diode die 320 adjacent the mounting substrate, to define a gap G therebetween. The mounting substrate may correspond to the submount 180 and the light emitting die may correspond to the LED die 100 of FIGS. 1 and 2 in some embodiments. More specifically, a bond region 330 that may be formed by an anode and/or a cathode contact of the LED die 320 (for example, as shown by contacts 160 and/or 170 of FIGS. 1 and 2), an anode and/or a cathode pad of the mounting substrate 310 (for example, as shown by pads 184 and/or 186 of FIGS. 1 and 2), and/or a bond layer therebetween (for example, as shown by element 188 of FIGS. 1 and 2), is recessed from an edge of the LED die 320 to define the gap G. The bond region 330 may therefore provide mechanical connection and may also provide one or more electrical connections. A conformal gel layer 340 is provided on the mounting substrate 310 and includes opposing surfaces that both conform to a contour of the mounting substrate 310. The conformal gel layer 340 extends at least partially into the gap G. In embodiments of FIG. 3, the conformal gel layer 340 only partially fills the gap G. However, in other embodiments, the conformal gel layer 340 may entirely fill the gap G and, in still other embodiments, the conformal gel layer 340 may be thicker than the height of the gap G. In some embodiments, the conformal gel layer 340 is less than about 20 μm thick. In other embodiments, it is less than about 10 μm thick and, in still other embodiments, it is about 5 μm or about 3 μm thick. In other embodiments, the gel layer 340 need not be conformal when it is so thin.

As was described above, the conformal gel layer 340 includes opposing surfaces that both conform to a contour of the mounting substrate 310 and/or the LED die 320. It will be understood that the conformal gel layer 340 need not conform to the contour of the mounting substrate and/or LED die on the entire surface thereof. For example, the conformal gel layer may be patterned so that it is not present on a portion of the mounting substrate/LED die or may be non-conformal on a portion of the mounting substrate/LED die. However, the conformal gel layer includes opposing surfaces that both conform to the contour of the mounting substrate/LED die over at least a portion thereof, for example adjacent the LED die in some embodiments, and in other embodiments surrounding the LED die.

Still referring to FIG. 3, in some embodiments, one or more conformal phosphor layers 350 are provided on the conformal gel layer 340, and a lens 360 may be provided or molded on the mounting substrate 310. For example, the phosphor layer 350 may convert at least some blue light that is emitted from a blue LED 320 into yellow light and/or red light, so as to provide the appearance of white light. In other embodiments, phosphor may be provided in the molded lens 360, in an encapsulation material, as one or more conformal or non-conformal layers, or phosphor need not be provided at all. As was described above in connection with the conformal gel layer 340, the conformal phosphor layer 350 need not be conformal over the entire contour of the mounting substrate or LED die.

The conformal gel layer 340 may provide a filler in the gap G that can prevent the phosphor layer 350 or the molded lens 360 from entering the gap G sufficiently to degrade operation of the light emitting device 300.

In some embodiments, the conformal gel layer 340, the phosphor layer 350 and the molded lens 360 may all comprise silicone. However, in some embodiments, the conformal phosphor layer 350 and molded lens 360 are not gels. For example, a Dow Corning Specification Sheet entitled "Dow Corning LED SOLUTIONS Lighting the way to advanced materials and solutions", Form No. 11-1679A-01, 2008, the disclosure of which is hereby incorporated herein by reference in its entirety as if set forth fully herein, describes various silicone-based gels, elastomers and resins that may be used for encapsulants, lens molding and overmolding. Normal refractive index and high refractive index materials may be provided. As shown, although various hardnesses may be attributed to the elastomers and resins, the gels have hardness that is so low as to be unmeasurable. In other embodiments, the gel may have a hardness of less than about 30 on the Shore A scale. The gel may also have an optical transmission of greater than about 95% and, in some embodiments, greater than about 98%, in the visible spectrum and a refractive index of greater than about 1.4 and, in some embodiments, greater than about 1.5.

As is well known to those having skill in the art, the hardness of plastics is commonly measured by a Shore® (Durometer) test or Rockwell hardness test. Both tests measure the resistance of plastics toward indentation and provide an empirical hardness value that may not necessarily correlate well to other properties or fundamental characteristics. Shore Hardness, using either the Shore A or Shore D scale, is generally used for rubbers/elastomers and is also commonly used for "softer" plastics, such as polyolefins, fluoropolymers and vinyls. The Shore A scale is generally used for "softer" rubbers, while the Shore D scale is generally used for "harder" ones. Many other Shore hardness scales, such as Shore O and Shore H hardness, exist but are less frequently used. As described in the above-cited Dow Corning Specification Sheet, the hardness of a gel is generally unmeasurable using any conventional test or scale.

In addition to having significantly lower hardness, a silicone-based gel may also have a significantly lower modulus compared to silicone-based elastomers and resins that were described above. The significantly lower modulus may be a primary factor in the ability of the gel to reduce or minimize stress on the light emitting diode die. For example, a Dow Corning silicone-based gel as described above may have a complex shear modulus (G*) of about 0.009 MPa at 25° C., while a comparable complex modulus for a silicone-based elastomer or resin may be about 12 MPa at 25° C. Thus, a silicone-based gel may have a complex modulus that is lower than that of a silicone-based elastomer or resin, and in some embodiments at least about one, two or three orders of magnitude lower than that of a silicone-based elastomer or resin. While the preceding values were quoted at 25° C., the complex modulus behavior of the gel continues to be orders of magnitude lower than the elastomers or resins over wide temperature ranges. Accordingly, conformal gel layers as described herein may provide a low modulus layer that can provide both higher light output and better stress relief than elastomer-type or resin-type silicone formulations.

It will also be understood that the silicone-based gels described above are merely examples, and many other silicone or non-silicone-based gels may be used. In some embodiments of FIG. 3, the conformal gel layer 350 may be selected from any of the gels, the phosphor layer may be selected from any of the elastomers, and the molded lens may be selected from any of the resins listed in the above-referenced Dow Corning Specification Sheet.

Figure 4:
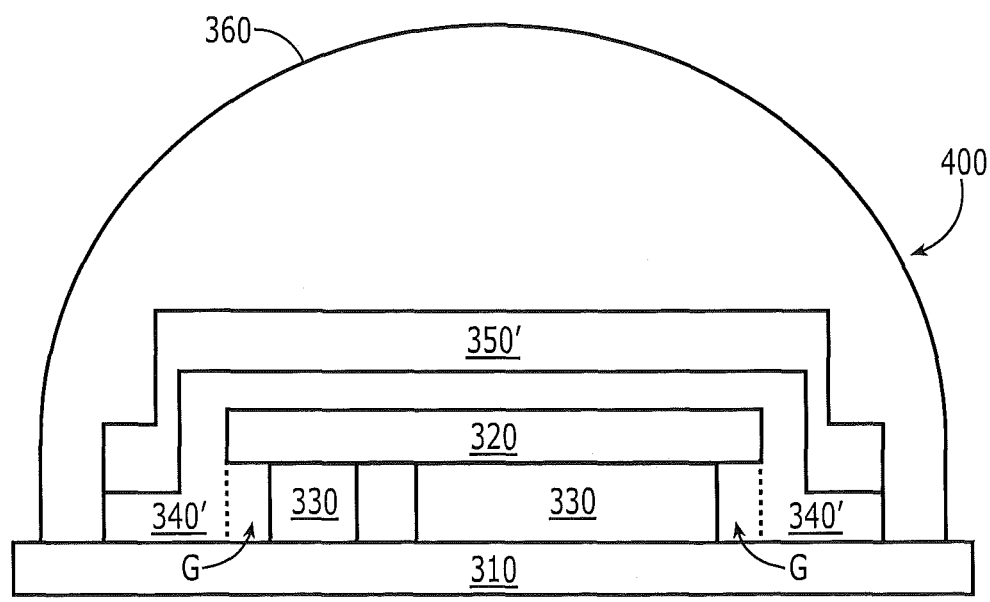

FIG. 4 illustrates other embodiments of light emitting devices 400, wherein the conformal gel layer 340' also extends from the gap G onto the LED die 320 and, in some embodiments, covers the LED die 320. In embodiments of FIG. 4, the phosphor layer 350' is a conformal phosphor layer. Accordingly, in embodiments of FIG. 4, the conformal gel layer 340' fills the gap G and also provides a buffer layer between the conformal phosphor layer 350' and the LED die 320. In other embodiments, even if the gap G is not presented or is otherwise filled, the conformal gel layer 340' may form a buffer layer or shock absorber between the conformal phosphor layer 350' and the LED die 320. In other embodiments, phosphor may be provided in the molded lens 360, in an encapsulation material, as one or more conformal or non-conformal layers, or phosphor need not be provided at all.

In embodiments of FIG. 4, the conformal gel layer 340' may be sufficiently thin so as to not adversely degrade performance of the light emitting device 400. More specifically, it is known that the LED die 320 can provide heat sinking to reduce degradation of the phosphor in the phosphor layer 350'. In some embodiments, the conformal gel layer 340' may be sufficiently thermally conductive and sufficiently thin so as to allow effective heat sinking to take place. In some embodiments, the conformal phosphor layer 350' may be between about 50 μm and about 100 μm thick and the conformal gel layer 340' may be between about 3 μm and about 10 μm thick. In some embodiments, the gel layer is less than about 20 μm thick. In other embodiments, the gel layer is less than about 10 μm thick and, in still other embodiments, it is about 5 μm or about 3 μm thick. Accordingly, the conformal gel layer 340' may be at least about five (5) times thinner than the conformal phosphor layer 350' in some embodiments. In other embodiments, the gel layer 340 need not be conformal when it is so thin.

Figure 5:
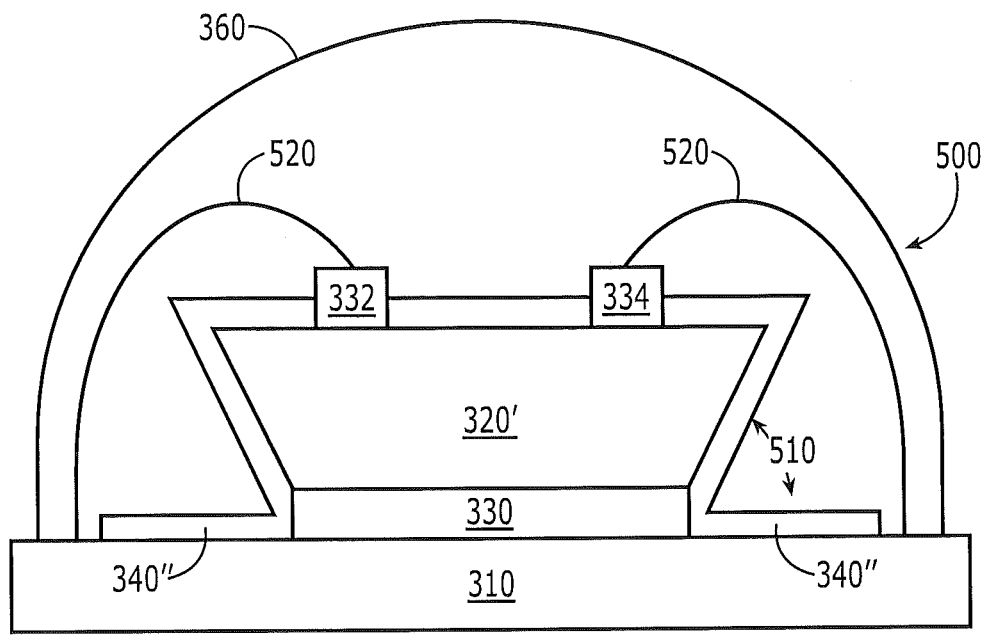

FIG. 5 is a cross-sectional view of a light emitting device according to other embodiments described herein. As shown in FIG. 5, these light emitting devices 500 include a horizontal LED die 320' that is mounted in non-flip-chip configuration, as described, for example, in the above-cited U.S. Publication No. 2011/0031502, so that the anode and cathode contacts 332 and 334 are remote from the mounting substrate 310 and a bond region 330 that may not provide electrical contact is provided to mount the LED on the mounting substrate 310. A conformal gel layer 340" is provided that extends from the mounting substrate 310 onto the LED die 320'.

In FIG. 5, a gap G is not shown between the bond region 330 and the LED die 320. Yet, the conformal gel layer 340" can provide potential advantages nonetheless. In particular, a conformal or non-conformal phosphor layer (not shown in FIG. 5) and/or the molded lens 360 may exert upward (separating) forces on the LED die 320', as shown by arrow 510. This force may degrade the bond of the bond region 330 and may cause the LED die 320 to at least partially detach from the mounting substrate 310 during thermal cycling (reflow or subsequent operation) or may cause the bond to degrade even if it remains attached. This force may be caused by the Coefficient of Thermal Expansion (CTE) of the phosphor layer and/or molded lens. The conformal gel layer 340' may provide a buffer layer against this degradation, due to its low hardness and low modulus. In other embodiments, phosphor may be provided in the molded lens 360, in an encapsulation material, as one or more conformal or non-conformal layers, or phosphor need not be provided at all.

Figure 6:
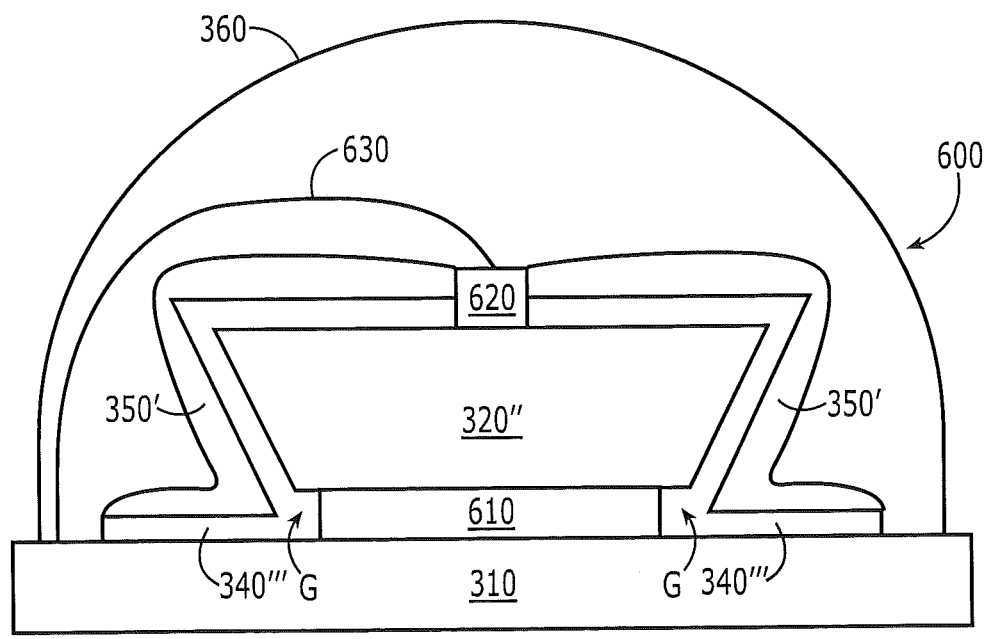

FIG. 6 illustrates other embodiments of light emitting devices 600 wherein a vertical LED die 320" includes one of the anode or cathode contact 610 adjacent the mounting substrate 310, and the other of the anode or cathode contact 620 remote from the mounting substrate 310, as was illustrated, for example, in the above-cited U.S. Pat. No. 6,791,119. A conformal gel layer 340''' fills the gap G between the contact 610 and the edge of the LED die 320', and also provides a buffer layer for the phosphor layer 350'. The phosphor layer 350' may be conformal, semi-conformal (as illustrated) or non-conformal. In these embodiments, the conformal gel layer 340''' can at least partially fill the gap G, if present, and can also reduce or prevent the LED die from lifting off due to forces generated by the thermal expansion of the phosphor layer 350' or the dome 360. In other embodiments of FIGS. 5 and 6, the sidewall walls of the LED die 320'/320" may be orthogonal to the faces thereof or may form an obtuse angle with the mounting substrate 310.

Figure 7:
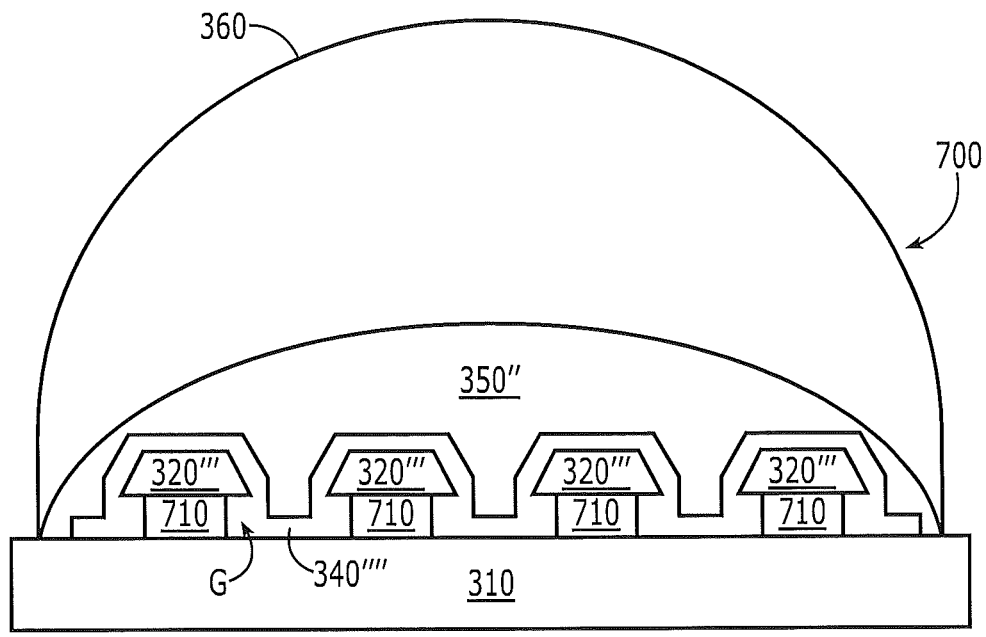

FIG. 7 illustrates other embodiments of light emitting devices 700. In these embodiments, a plurality of LED die 320''' are mounted on a mounting substrate 310 using a bonding region 710 that may also provide one or more electrical contacts. Any of the embodiments of LED die that are described herein may be used. A conformal gel layer 340"" is provided on the face of the mounting substrate 310 and on the LED dies 320'''. A glob 350" of phosphor is provided, as well as a molded lens 360. Unexpectedly, in embodiments of FIG. 7, it has been found that the conformal gel layer 340"" can promote adhesion of the glob 350" of phosphor and/or the lens 360 in the device 700, by acting as a shock absorber against the effects of thermal expansion in the phosphor layer 350" and/or the lens 360. Also unexpectedly, the conformal gel layer 340"" may be more effective than a non-conformal gel layer, such as may be provided by conventional encapsulant, by providing additional gripping surface to which the phosphor layer 350" and/or lens 360 may adhere, and may also preserve the heat sinking abilities of the LED dies 320".

Various embodiments illustrated in FIGS. 3-7 and described herein can also provide a light emitting device that comprises a light emitting diode die and a gel layer that is less than about 20 μm thick on the light emitting diode die. The gel layer may be a conformal layer including opposing surfaces that both conform to a contour of the light emitting diode die. In other embodiments, the gel layer is less than about 10 μm thick and, in still other embodiments, the gel layer is about 3 μm or about 5 μm thick. A phosphor layer may be provided on the gel layer.

Yet other embodiments illustrated in FIGS. 3-7 and described herein can also provide a light emitting device that comprises a light emitting diode die, a gel layer on the light emitting diode die and a phosphor layer on the gel layer. The gel layer and the phosphor layer may both comprise silicone, but the phosphor layer is not a gel. Moreover, the gel layer may be at least five times thinner than the phosphor layer. Furthermore, the gel layer may have a modulus that is less than the phosphor layer and, in some embodiments, the gel layer has a modulus that is at least one, two or three orders of magnitude less than the phosphor layer.

Fabrication

Figure 8:
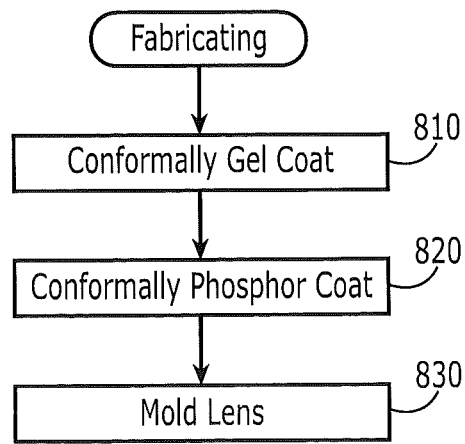
FIG. 8 is a flowchart of methods of fabricating light emitting devices according to various embodiments described herein.

Methods of fabricating light emitting devices according to various embodiments described herein will now be described. In particular, referring to FIG. 8 at Block 810, a mounting substrate having a light emitting diode die mounted thereon is conformally gel coated using, for example, various processes that will be described below. Then, referring to Block 820, if a conformal phosphor coating is to be provided, phosphor is conformally coated on the mounting substrate having a light emitting diode die mounted thereon that was conformally gel coated in Block 810. In other embodiments, a non-conformal phosphor coating may be applied or no phosphor coating may be applied. Further processing is then performed at Block 830, for example to mold a lens, etc. It will be understood that the operations of Blocks 820 and 830 may be performed out of order from that shown in FIG. 8, and one of these blocks may also be omitted. Accordingly, FIG. 8 illustrates methods of fabricating a light emitting device wherein a mounting substrate having a light emitting diode die mounted thereon is conformally gel coated and then the gel-coated mounting substrate is phosphor-coated and/or a lens is molded thereon.

Various techniques may be used to conformally gel coat the mounting substrate having a light emitting die mounted thereon (Block 810). Specifically, in some embodiments, a thin conformal gel coat may be applied by diluting a gel with a solvent, such as xylene, which can then evaporate off, leaving a thin conformal gel coating layer. A spray process, a drop dispense and/or other process may be used. In a spray process, the gel that is diluted in the solvent is sprayed onto the mounting substrate having the light emitting diode die mounted thereon, such that at least some of the solvent evaporates. Multiple spray passes may be used. In a dispensing process, the gel that is diluted in the solvent may be dispensed onto the mounting substrate having the light emitting diode die mounted thereon, and then at least some of the solvent may be evaporated, for example by heating. Multiple dispenses may be used. Other techniques of forming a conformal gel coating may be used.

Experimental Results

The following examples shall be regarded as merely illustrative and shall not be construed as limiting the invention.

Figure 9A:
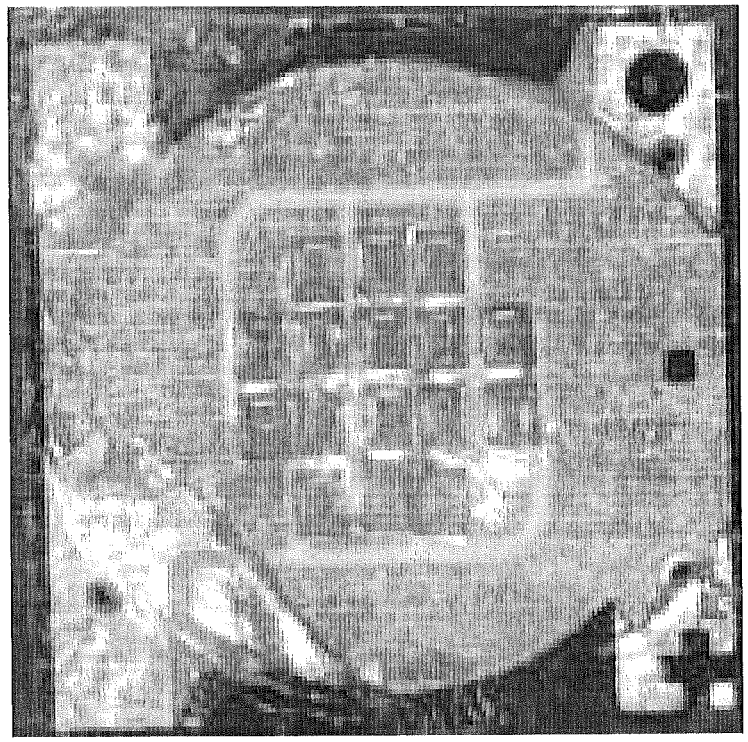
FIGS. 9A-9B are photographs illustrating results of reflow operations for light emitting devices that do not use a conformal gel layer according to various embodiments described herein.
Figure 9B:
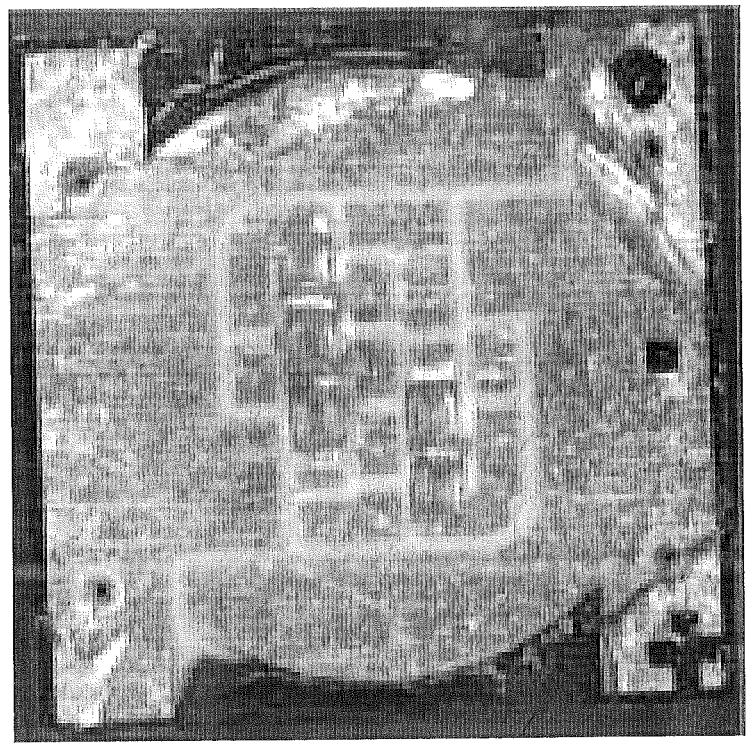

FIG. 9A is a photograph of an array of 16 LED die on a mounting substrate. A lens was then molded on the mounting substrate of FIG. 9A, and the device was subject to a reflow in a standard reflow oven using a typical reflow profile with a 260° C. peak for lead-free solder attach. The lens was then removed. FIG. 9B illustrates the result after lens removal. As shown, only five of the LED die remain attached to the substrate, so that eleven of the die came off upon removal of the lens, indicating severe degradation of the die attach.

Figure 9C:
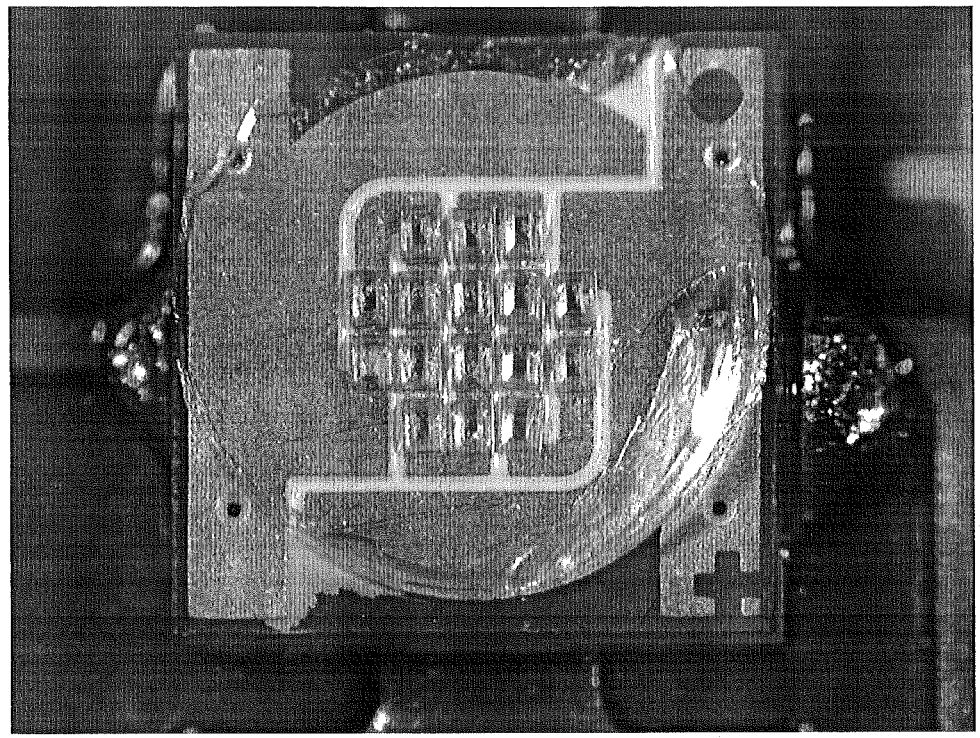
FIGS. 9C-9D are photographs of the same light emitting devices that do use a conformal gel layer according to various embodiments described herein.
Figure 9D:
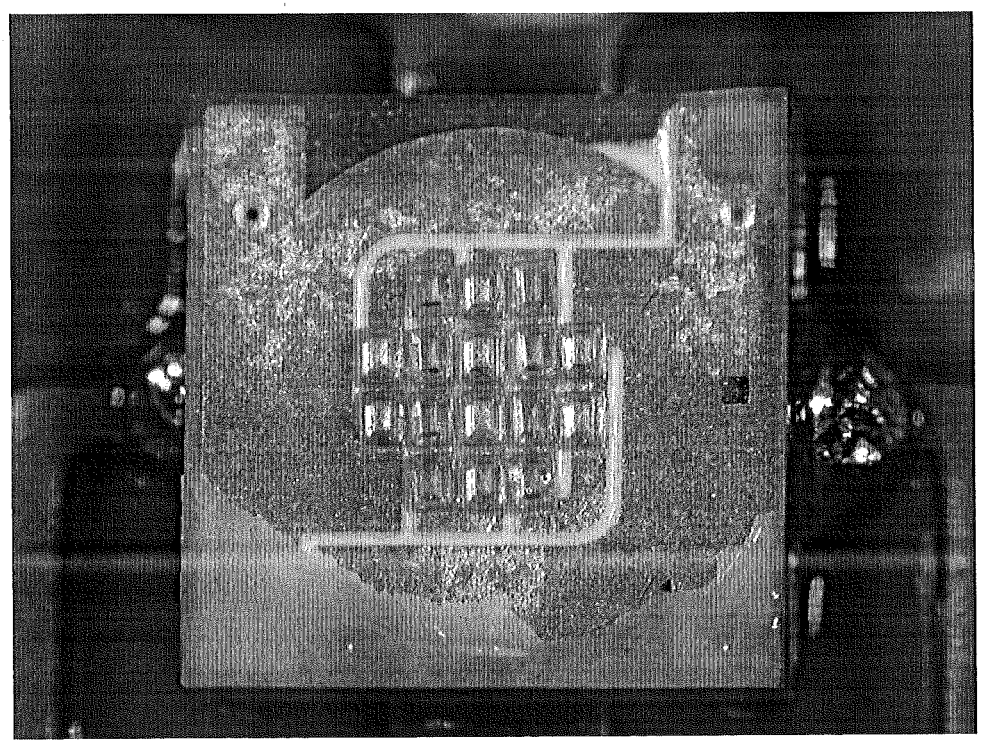

FIG. 9C illustrates an identical device as FIG. 9A, except that a conformal gel layer of Dow OE-6450 gel, about 7 μm thick, was applied before molding the lens. The device was then subject to fifteen (15) reflows in the standard reflow oven using the typical reflow profile with a 260° peak for lead-free solder attach, and the lens was then removed. No die attach failures were found, as illustrated in FIG. 9C. FIG. 9D illustrates an identical device as FIG. 9A, except the conformal gel layer of FIG. 9C was coated with a conformal phosphor layer, about 50 μm thick, prior to molding the lens. Again, fifteen (15) reflows in the standard reflow oven using the typical reflow profile with a 260° C. peak for lead-free solder attach were performed prior to removing the lens. Again, no die attach failures were found. Accordingly, a conformal gel layer according to various embodiments described herein can improve the reliability of a light emitting device and reduce or prevent die attached degradation due to subsequent processing and/or device operation.

Additional Discussion

Additional discussion of various embodiments described herein will now be provided. Various embodiments described herein can provide a thermally robust LED package that may, in some embodiments, use horizontal LED dies that are mounted on mounting substrates, such that the anode and cathode contacts are adjacent the mounting substrate. A thin conformal gel coat is applied to the die or die arrays by, for example, diluting the gel with xylene, which evaporates off, leaving a very thin layer. The gel coat may be applied with a heated spray process or a drop dispense of highly diluted silicone (for example, five parts xylene by volume to one part silicone) followed by heating. Coating can be performed, for example, prior to phosphor deposition for white light emitting devices or just prior to lens molding for blue light emitting devices. The gel can provide a buffer to the harder silicones used for the phosphor coating or lens molding, to reduce or minimize stress on the die attach metal bonds during temperature reflow and/or package operation.

For applications where the thin, conformal gel coating is applied under the conformal phosphor layer, the thin conforming gel coating may maintain the conformal phosphor layer very close to the LED die surface, to thereby provide similar heat sinking as that of a part without the gel.

Conventionally, a glob or fill approach has been used to cover the LED die with a gel-like material under a harder lens material. Some embodiments described herein can provide similar benefits as conventional glob or fill gel, while allowing improved lens adhesion, particularly for small die arrays. In such small die arrays, the topography may be maintained to provide better mechanical attachment of the phosphor layers and/or lens. It may also maintain the necessary heat sinking of the phosphor layer to reduce or prevent heating and charring.

Moreover, a gel layer according to various embodiments described herein may provide unexpected advantages for small LED dies. In particular, as the die size is reduced from about 1 mm$^2$, the potential for negative impact on the die attach due to the silicone resin or elastomer properties is increased, since the die attach area becomes increasingly smaller. In addition to a reduction in the absolute die attach area, the relative die attach area as a percentage of total die area is also generally reduced, as the electrode spacing, electrode setbacks from the device edges and/or street widths may follow the same design rules as the larger dies. Accordingly, the ratios of the perimeter gap area and electrode gap area under the die relative to the die attach area generally increase as the die is made smaller, exacerbating the impact of silicone resin or elastomer penetration in these areas given the reduction in absolute die attach area. Die sizes below about 0.25 mm$^2$ may be particularly sensitive. For example, on a 350× 470 mm direct attach die, the die attach pads represent about 58% of the total die area. However, on the 240×320 mm direct attach die shown in FIGS. 9A-9D, the die attach area is reduced to about 48% of the total die area. For reference, on a 1 mm$^2$ die, the die attach area is greater than about 80% of the die area. Accordingly, a gel layer according to various embodiments described herein may be particularly useful as LED die size decreases.

Gel Underfill Layers

Various embodiments described above can provide conformal and/or thin gel layers for light emitting devices. However, there may be other applications where it is desirable to restrict the gel to an underfill layer in the gap(s) between the light emitting diode die(s) and the mounting substrate that is adjacent thereto, without completely covering the LED die(s), e.g., without providing substantial amounts of gel on the outer face of the LED die(s) and without providing substantial amounts of gel on the substrate substantially beyond the array of LED die(s). Thus, it may be desirable to provide a gel underfill at the base of the LED die(s) that may extend at least partially onto the sidewalls of the LED die(s), but that does not extend on the substrate substantially beyond the LED die(s) and also does not extend substantially on an outer face of the LED die(s). Leaving most of the outer surface of the LED die(s) substantially bare and leaving the substrate beyond the LED die(s) substantially bare can improve or maximize thermal heat sinking and adhesion of a phosphor layer and/or an overmolded lens to the light emitting device.

Figure 10:
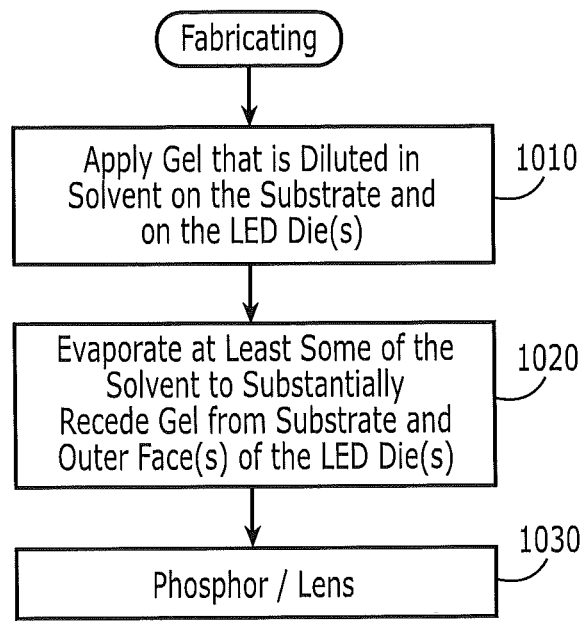
FIG. 10 is a flowchart of methods of fabricating light emitting devices according to various embodiments described herein.

FIG. 10 is a flowchart of fabricating a light emitting device according to various embodiments provided herein. A mounting substrate and one or more LED die(s) adjacent the mounting substrate are provided, to define a gap between a respective LED die(s) and the mounting substrate that is adjacent thereto. As used herein, more than one LED die that is provided adjacent the mounting substrate is also referred to as an "array" of LED dies.

Referring to Block 1010, a gel that is diluted in a solvent is applied on the substrate and on the LED die(s). The gel may be applied by dispensing at least one drop of gel that is diluted in the solvent, by spraying the gel that is diluted in the solvent and/or by other application techniques. In some embodiments, the gel may be diluted in the solvent at a ratio of about 1:4-5 by volume.

Then, at Block 1020, at least some of the solvent is evaporated so that the gel remains in the gaps, but does not completely cover the LED die(s). In some embodiments, the gel substantially recedes from the substrate beyond the array of LED die(s), and also substantially recedes from an outer face of the LED die(s). A conformal or nonconformal layer of phosphor and/or a lens may then be applied and/or attached at Block 1030, according to any of the techniques described above and/or using other techniques.

Various embodiments described herein can provide a thermally robust light emitting device. A gel underfill is formed at the base of the LED die(s) by applying a solution of highly diluted gel to the LED die(s). As the solvent is driven off by evaporation, surface tension and/or other forces pulls the gel substantially off the outer die face(s) and off the mounting substrate substantially beyond the LED die(s), forming a gel underfill layer around the base of the LED die(s). The level of filling around and between the LED dies can be varied based on, for example, the initial dispense volume and/or the ratio of solvent to gel. Thus, the gel does not completely cover the LED die(s).

By leaving the outer face(s) of the LED die(s) substantially bare and by leaving the substrate beyond the LED die(s) substantially bare, according to some embodiments described herein, improved or maximized thermal heat sinking and adhesion of a phosphor layer and/or overmolded lens may be provided. At the same time, the gel underfill layer can reduce or prevent the harder encapsulants typically used in the phosphor layer and/or lens molding from penetrating in the gap under the LED die(s), to thereby reduce or minimize stress on the die attach metal bonds during high temperature reflow and/or device operation.

Accordingly, the underfill may be restricted to the base of die(s) and the die face(s), and the substrate beyond the die(s) may be left substantially bare, even though the gel solution is applied all over the substrate and the outer face(s) of the die(s). Given the LED die size, geometry and packing density, it may be very difficult to provide conventional underfill dispense around the perimeter of the LED die(s). However, with the outer face(s) substantially bare according to various embodiments described herein, the phosphor and/or lens can be in intimate contact with the die(s) to increase or maximize thermal heat sinking and adhesion. The surface tension also can restrict the coating area to the die(s), leaving substantially no or minimal gel on the substrate face outside the die(s). This allows the phosphor layer or lens to attach to the substrate and outer die face(s), which can provide similar lens attachment strength as a package with no gel underfill.

Figure 11:
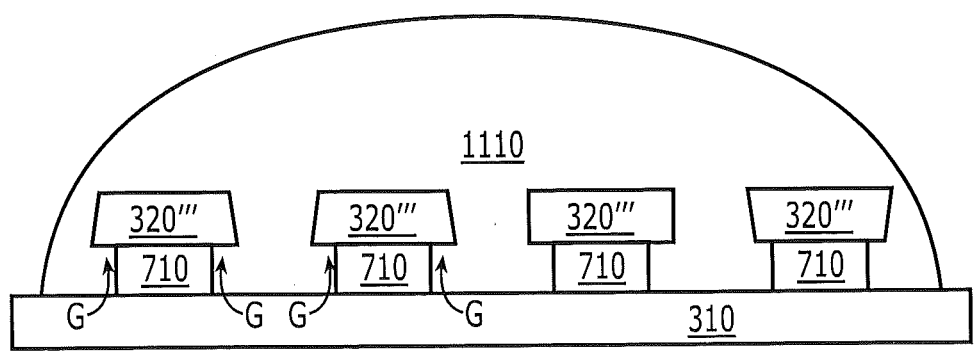
FIGS. 11-19 are cross-sectional views of light emitting devices according to various embodiments described herein, during intermediate or final fabrication according to various embodiments described herein.

FIG. 11 is a cross-sectional view of a light emitting device according to various embodiments described herein, and may correspond to a light emitting device after a gel is applied at Block 1010 of FIG. 10, but before evaporation at Block 1020 of FIG. 10.

Specifically, referring to FIG. 11, an array of LED dies 320''' is provided adjacent a mounting substrate 310 to define a gap G between a respective LED die 320''' and the mounting substrate 310 that is adjacent thereto. The gap G may be established by a bonding region 710, as was described above. As shown in FIG. 11, one or more LEDs 320''' may be provided. The LEDs 320''' may be identical or different therebetween. For example, as shown in FIG. 11, the LED sidewalls may be vertical (orthogonal), oblique (obtuse or acute) or beveled. A gel that is diluted in a solvent 1110 is provided on the substrate 310 and on the LED die(s) 320'''. The gel that is diluted in a solvent may be applied using a heated or unheated spray process or a heated or unheated drop dispense of highly diluted silicone in a solvent. For example, about four to five parts xylene by volume to about one part silicone gel may be used. FIG. 11 illustrates a drop profile of the gel layer that is diluted in solvent that may be obtained, for example, using drop dispensing. When spraying is used, a conformal, semiconformal or nonconformal gel layer that is diluted in a solvent may be produced.

FIGS. 12-15 are cross-sectional views of light emitting devices according to various embodiments described herein, and may correspond to light emitting devices after evaporating at least some of the solvent at Block 1020 of FIG. 10. In all of the embodiments of FIGS. 12-15, at least some of the solvent 1110 is evaporated so that the gel remains in the gaps G, but does not completely cover the LED die(s) 320'''.

Figure 12:
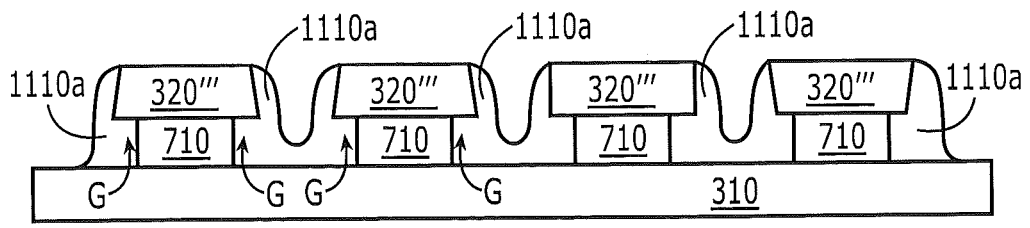

Referring now to FIG. 12, at least some of the solvent 1110 is evaporated, for example at room temperature or above, so that the gel 1110a remains in the gap(s) G, but substantially recedes from the substrate 310 beyond the LED die(s) 320''' and also substantially recedes from an outer face of the LED die(s) 320'''. As also shown in FIG. 12, the gel may also fill the gap(s) G. Moreover, as also shown, the gel may also extend on the substrate 310 between adjacent LED dies 320''' in the array and may also extend fully onto sidewalls of the LED die(s) 320'''.

In FIG. 12, the gel layer 1110a extends along the entire sidewalls of the LED die(s) 320'''. In contrast, in FIG. 13, the gel layer 1110b extends only partially onto the sidewalls of the LED die(s) 320'''. Moreover, in FIG. 14, the gel layer 1110c does not extend onto the LED die sidewalls at all. Finally, in FIG. 15, the gel layer 1110d does not extend fully onto the substrate between adjacent LED dies 320'''.

Figure 13:
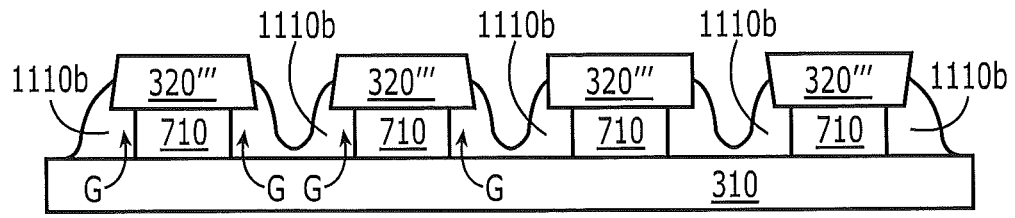
Figure 14:
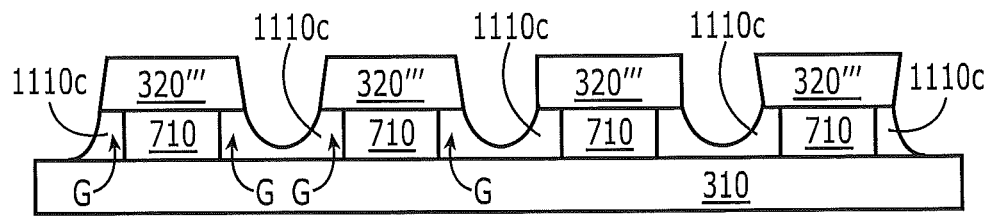
Figure 15:
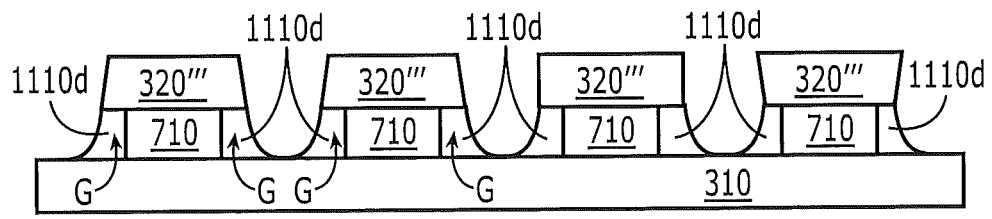

Thus, during evaporation, the gel remains in the gap(s) G, but substantially recedes from the substrate 310 beyond the light emitting diode die(s) and also substantially recedes from outer face(s) of the LED die(s) (FIGS. 12-15). The gel may also remain between adjacent LED die(s) (FIGS. 12-14) or may at least partially recede from between the adjacent LED die(s) (FIG. 14). The LED gel may also remain fully (FIG. 12) or partially (FIG. 13) on the sidewalls of the LED die(s) or may substantially recede from the sidewalls of the LED die(s) (FIGS. 14-15).

The amount by which the gel recedes may be governed by many factors, including, but not limited to, the geometry and material compositions of the substrate, the LEDs and the bond regions; the composition, volume and wettability of the gel relative to these regions; the composition and volume of the solvent; the relative volumes of gel and solvent; and/or the evaporation conditions, such as time and temperature. For example, the gel may substantially recede from a reflective surface of the substrate, that comprise, for example, silver, aluminum and/or reflective ceramics such as $Al_2O_3$.

FIGS. 12-16 also illustrate light emitting devices according to various embodiments described herein that include a mounting substrate 310 and one or more (an array) of LED dies 320''' adjacent the mounting substrate 310, to define a gap G between a respective LED die 320''' and the mounting substrate 310 that is adjacent thereto, wherein the gap G may be defined by one or more bond regions 710. A gel layer 1110a, 1110b, 1110c and/or 1110d is provided on the mounting substrate 310 that extends at least partially in the gaps G between the LED die(s) 320''' and the substrate 310 adjacent thereto, but does not completely cover the LED die(s) 320'''. In some embodiments, the gel layer does not extend on the substrate 310 substantially beyond the LED die(s) 320''' and also does not extend substantially on an outer face of the LED die(s) 320'''. The gel layer may fill the gaps, as shown in FIGS. 12-15; may extend between adjacent LED dies in the array, as shown in FIGS. 12-14; may extend fully on sidewalls of the LED die(s), as shown in FIG. 12; may extend partially on the sidewalls, as shown in FIG. 13; or may not extend substantially on the sidewalls, as shown in FIG. 15.

FIGS. 16-19 are cross-sectional views of LED devices according to various other embodiments described herein, after application of phosphor and/or a lens at Block 1030 of FIG. 10. These figures are based on the structure of FIG. 14. However, phosphor and/or a lens may be applied to the structures of FIGS. 12-13 and/or 15 in other embodiments.

Figure 16:
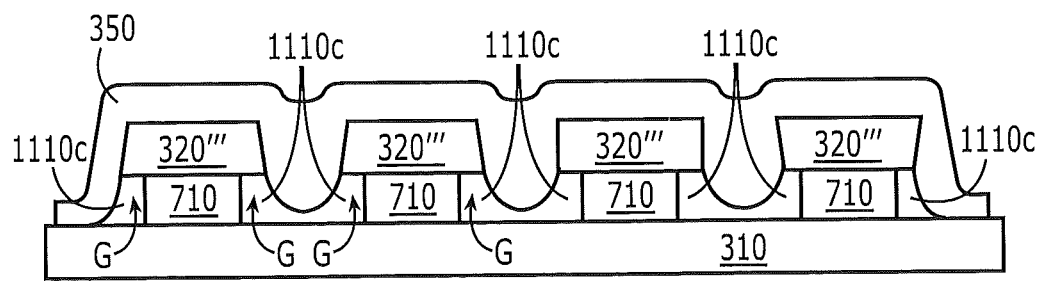
Figure 17:
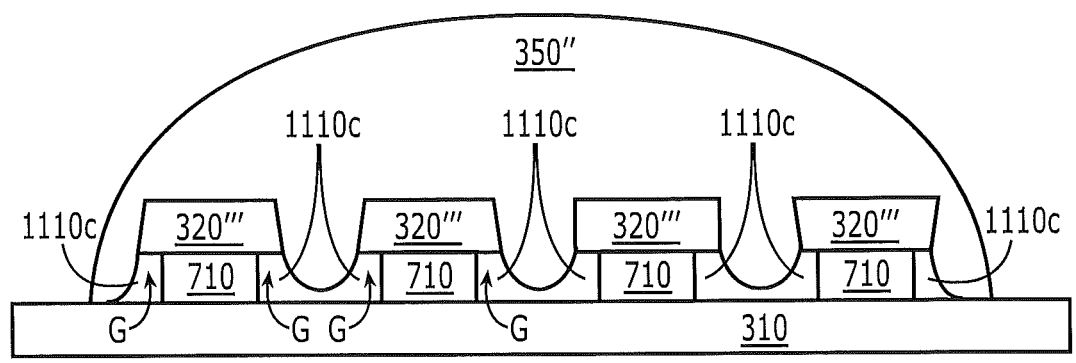
Figure 18:
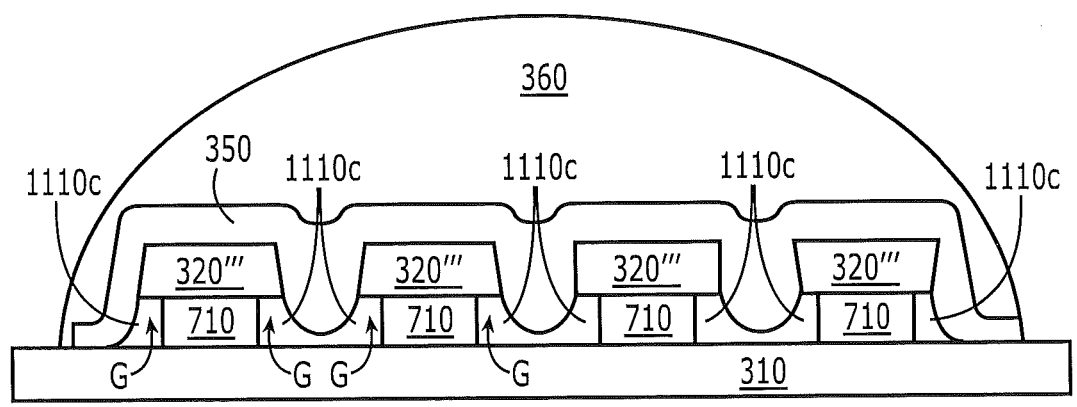
Figure 19:
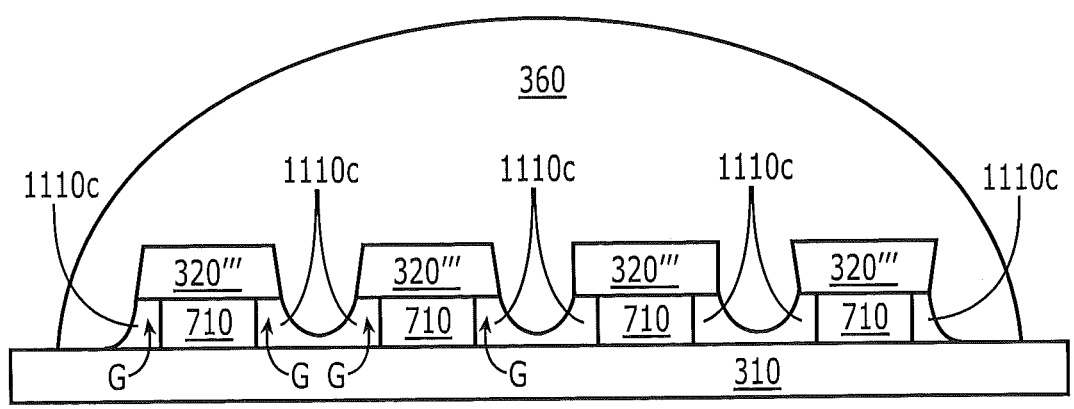

Referring to FIG. 16, a conformal or semiconformal phosphor layer 350 is applied, for example using techniques described above, that extends directly on the substrate 310 substantially beyond the LED die(s) and directly on the outer face(s) of the LED die(s). In FIG. 17, a nonconformal phosphor layer 350″ is applied, for example using techniques described above, that extends directly on the substrate 310 substantially beyond the LED die(s) and directly on the outer face(s) of the LED die(s). Alternatively, in FIG. 18, a conformal or semiconformal phosphor layer 350 may be applied that is directly on the substrate substantially beyond the array of LED die(s) and directly on the outer face(s) of the LED die(s) 320‴, and a lens 360 may be applied, for example by molding, on the phosphor layer 350. Finally, in FIG. 19, a lens 360 is applied or molded on the substrate 310 substantially beyond the LED die(s) 320‴ and directly on the outer face(s) of the LED die(s) 320‴. Phosphor may be included in and/or on the lens 360.

Figure 20:
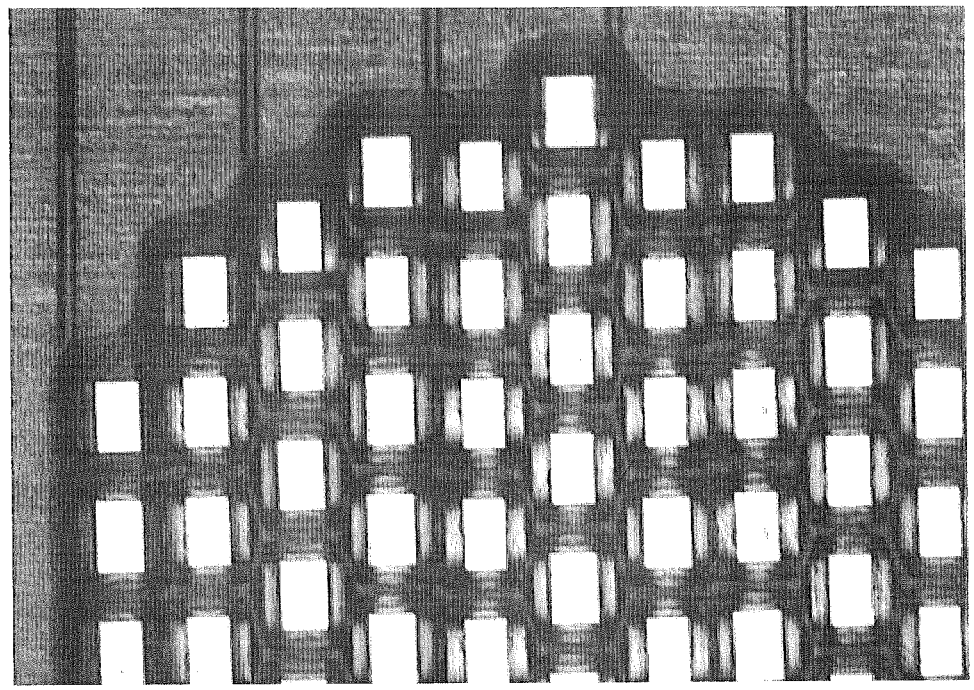
Figure 21:
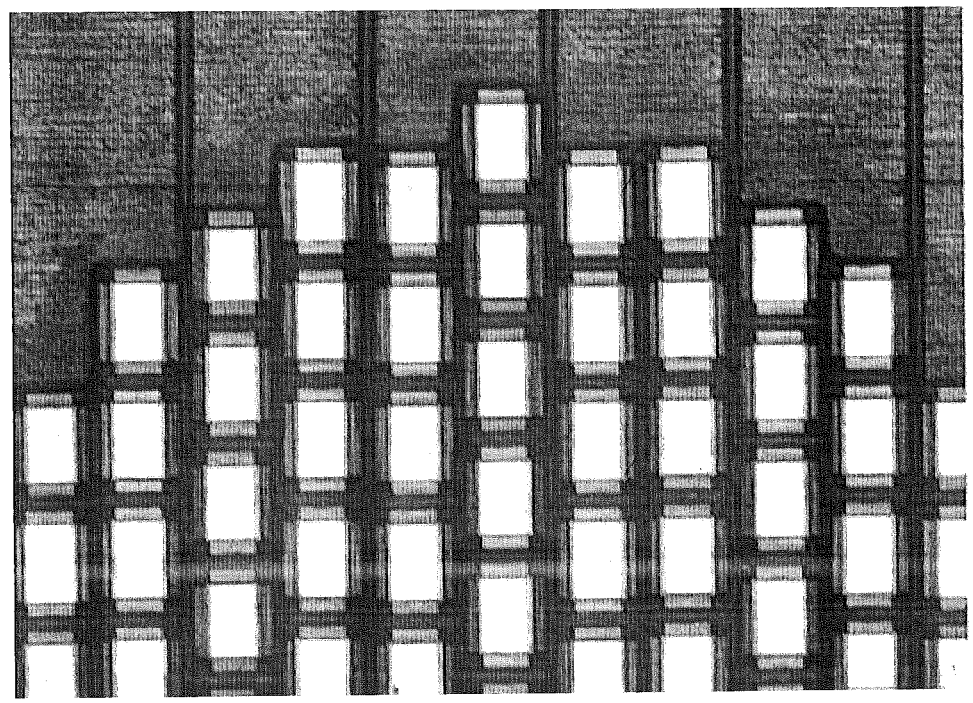

FIGS. 20-22 are optical microscope images of light emitting devices according to various embodiments described herein. FIG. 20 corresponds to Block 1010 of FIG. 10, wherein a wet, highly diluted 4:1 solution of xylene:silicone gel is dispensed on top of a direct attach LED die array. Surface tension keeps the fluid held tight to the array.

FIGS. 21 and 22 illustrate light emitting devices after evaporating pursuant to Block 1020 of FIG. 10. Heat was applied, for example, at about 150° C. for about 1-2 hours to drive off the solvent and cure the gel. In some embodiments, an initial one-hour cure may be provided at about 150° C., followed by an additional one-hour cure at about 150° C. after phosphor and/or lens application. The solvent evaporation and receding of the gel may take place in the first few minutes of the initial cure. As shown in FIG. 21, the gel has substantially receded from the substrate beyond the array of LED die(s) (a discoloration is shown where the gel/solvent originally was present), and also substantially recedes from the outer faces (tops) of the LED dies. The gel remains in the gaps and also remains on the substrate between adjacent LED dies.

FIG. 22 is a more magnified optical microscope image showing the formation of the gel coating 1110c around the bases of the LED dies and between the LED dies. As shown, the outer (top) surfaces of the LED dies and the remote (upper) surfaces of the sidewalls are substantially bare.

Figure 24:
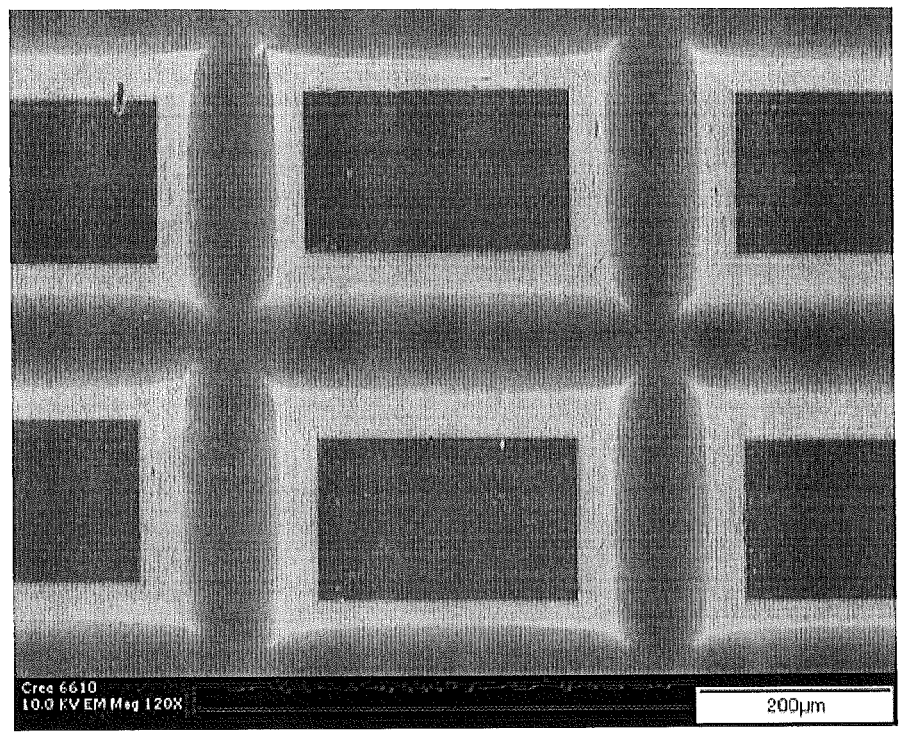
Figure 25:
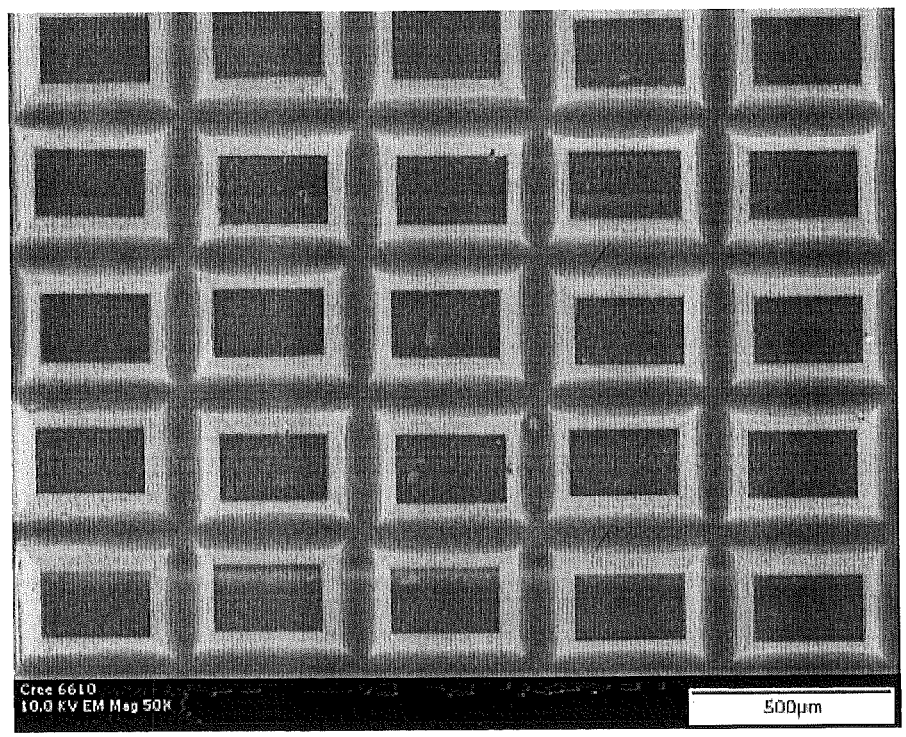

FIGS. 23-25 illustrate Scanning Electron Microscope (SEM) images of light emitting devices according to various embodiments described herein. Specifically, FIG. 23 is a tilted SEM image showing the gel formation around the bases of the dies, extending to the substrate and extending between the dies, with minimal amounts of gel seen on the remote (upper) surfaces of the sidewalls and on the outer faces (tops) of the dies. FIG. 24 is an analogous plan view of the SEM image showing the gel between the dies with minimal amounts of gel on the upper surfaces of the sidewalls and on the tops of the LED dies. FIG. 25 is an analogous SEM image at a lower magnification, again showing the gel between the dies with minimal amounts of gel on the upper surfaces of the sidewalls and on the tops of the dies.

Figure 26:
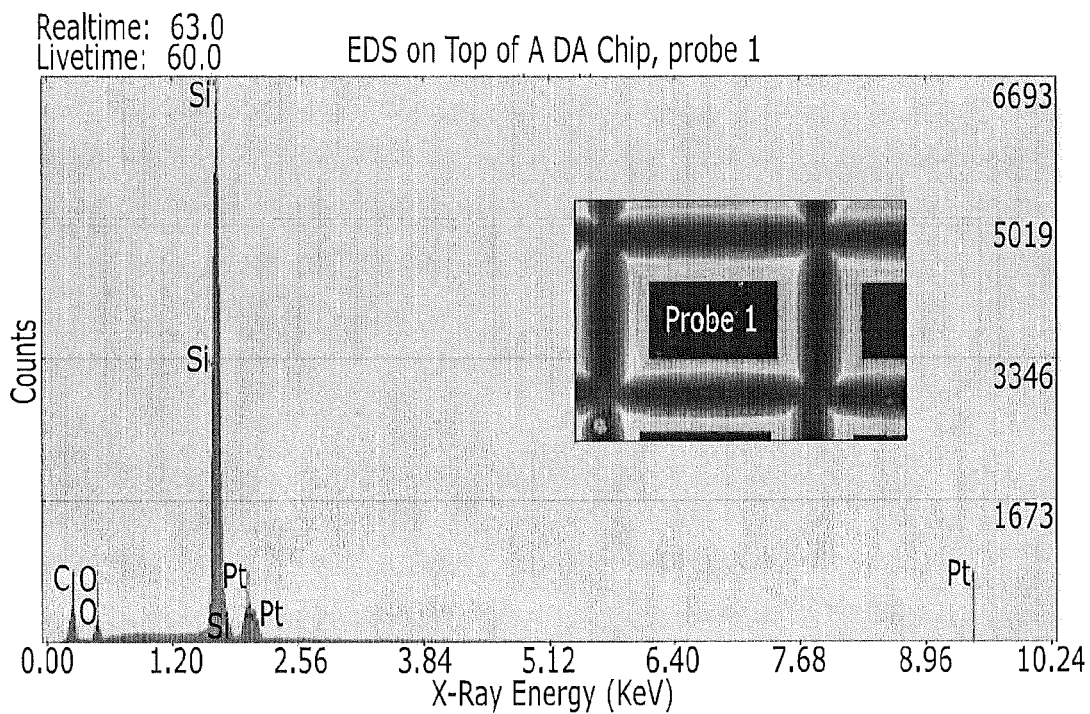
FIGS. 26-27 are Electron Diffraction Spectroscopy (EDS) spectra of light emitting devices according to various embodiments described herein.
Figure 27:
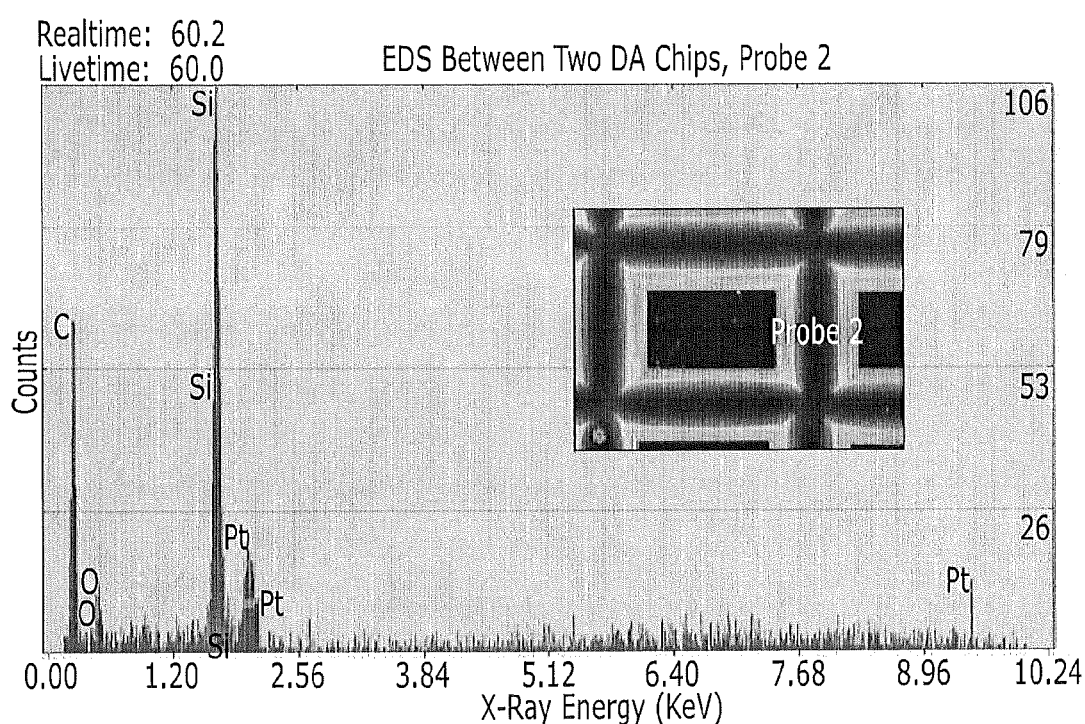

FIGS. 26-27 are Electron Diffraction Spectroscopy (EDS) spectra of light emitting devices according to various embodiments described herein. Specifically, FIG. 26 is an EDS taken on the top (outer) face of the LED die. FIG. 26 illustrates a silicon carbide composition of the LED die, with a low carbon (C) peak that confirms minimal gel presence on the outer face. Note that the platinum (Pt) peak is from a thin conductive coating that is applied for SEM purposes. In contrast, FIG. 27 is an EDS spectrum taken between the dies, to show an increased carbon peak from the presence of the silicone gel between the dies.

Without wishing to be bound by any theory of operation, surface tension and/or other forces in a gel diluted in a solvent may be used to cause selective receding of the gel during evaporation of the solvent, so that the gel does not completely cover the LED dies and in some embodiments substantially recedes from the substrate beyond the array of LED dies, and also substantially recedes from outer faces of the LED dies, but remains in the gaps at the bases of the LED dies, and may also remain on the substrate between adjacent LED dies and/or at least partially on the LED die sidewalls. The gel may thereby be blanket-applied by drop dispensing, spray coating and/or other blanket techniques, yet the final product may only have gel where it is desired and may have substantially no gel in areas where it is not desired for thermal and/or structural purposes.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device comprising:
a mounting substrate;
an array of light emitting diode dies adjacent the mounting substrate;
an array of bond regions, a respective one of which connects a respective light emitting diode die to the mounting substrate, a respective bond region being recessed from an edge of a respective light emitting diode die to define a respective gap between a respective light emitting diode die and the mounting substrate that is adjacent thereto; and
a gel layer on the mounting substrate that fills the gaps between the light emitting diode dies and the substrate adjacent thereto but does not completely cover the light emitting diode dies;
wherein the gel layer also extends between adjacent light emitting diode dies in the array.

2. A light emitting device comprising:
a mounting substrate;
an array of light emitting diode dies adjacent the mounting substrate to define a gap between a respective light emitting diode die and the mounting substrate that is adjacent thereto; and
a gel layer on the mounting substrate that extends at least partially in the gaps between the light emitting diode dies and the substrate adjacent thereto but does not completely cover the light emitting diode dies;

wherein the gel layer also extends between adjacent light emitting diode dies in the array.

3. A light emitting device according to claim 2 wherein the gel layer does not extend on the substrate substantially beyond the array of light emitting diode dies and also does not extend substantially on an outer face of the light emitting diode dies.

4. A light emitting device according to claim 3 wherein the gel does not extend on reflective areas of the substrate substantially beyond the array of light emitting diode dies.

5. A light emitting device according to claim 2 further comprising a phosphor layer directly on the substrate that extends beyond the array of light emitting diode dies and that also extends directly on the outer faces of the light emitting diode dies.

6. A light emitting device according to claim 2 further comprising a lens that spans the array of light emitting diode dies and that extends directly on the substrate beyond the array of light emitting diode dies and directly on the outer faces of the light emitting diode dies.

7. A light emitting device comprising:
a mounting substrate;
an array of light emitting diode dies adjacent the mounting substrate to define a gap between a respective light emitting diode die and the mounting substrate that is adjacent thereto; and
a gel layer on the mounting substrate that extends at least partially in the gaps between the light emitting diode dies and the substrate adjacent thereto but does not completely cover the light emitting diode dies;
wherein the gel layer does not extend on the substrate substantially beyond the array of light emitting diode dies and also does not extend substantially on an outer face of the light emitting diode dies, and
wherein the gel layer also extends at least partially on sidewalls of the light emitting diode dies.

8. A light emitting device comprising:
a mounting substrate;
a light emitting diode die adjacent the mounting substrate to define a gap between the light emitting diode die and the mounting substrate that is adjacent thereto; and
a gel layer on the mounting substrate that extends at least partially in the gap between the light emitting diode die and the substrate adjacent thereto but does not completely cover the light emitting diode die;
wherein the gel layer does not extend on the substrate substantially beyond the light emitting diode die and also does not extend substantially on an outer face of the light emitting diode die, and
wherein the gel layer also extends at least partially on sidewalls of the light emitting diode die.

9. A light emitting device according to claim 8 wherein the gel layer fills the gap.

10. A light emitting device according to claim 8 further comprising a phosphor layer directly on the substrate beyond the light emitting diode die and directly on the outer face of the light emitting diode die.

11. A light emitting device according to claim 8 further comprising a lens that spans the light emitting diode die and that extends directly on the substrate beyond the light emitting diode die and directly on the outer face of the light emitting diode die.

12. A light emitting device according to claim 8 wherein the gel does not extend on reflective areas of the substrate substantially beyond the light emitting diode die.

* * * * *